US006711193B2

United States Patent
Yamasaki

(10) Patent No.: US 6,711,193 B2
(45) Date of Patent: Mar. 23, 2004

(54) SEMICONDUCTOR LASER DEVICE AND METHOD OF MANUFACTURING THE SAME

(75) Inventor: Yukio Yamasaki, Daito (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/028,175

(22) Filed: Dec. 20, 2001

(65) Prior Publication Data

US 2002/0105986 A1 Aug. 8, 2002

(30) Foreign Application Priority Data

Dec. 20, 2000 (JP) .................................. 2000-386992

(51) Int. Cl.[7] .................................................. H01S 5/37
(52) U.S. Cl. .......................................... 372/45; 372/43
(58) Field of Search .............................. 372/45, 50, 43, 372/46; 438/448, 453

(56) References Cited

U.S. PATENT DOCUMENTS

| | | | | |
|---|---|---|---|---|
| 6,312,967 B1 | * | 11/2001 | Ikeda | 438/22 |
| 6,319,742 B1 | * | 11/2001 | Hayashi et al. | 438/46 |
| 6,493,367 B1 | * | 12/2002 | Ito et al. | 372/45 |
| 2001/0029086 A1 | * | 10/2001 | Ogawa et al. | 438/448 |
| 2002/0022288 A1 | * | 2/2002 | Hayashi et al. | 438/47 |
| 2002/0027933 A1 | * | 3/2002 | Tanabe et al. | 372/45 |
| 2002/0064195 A1 | * | 5/2002 | Takeya et al. | 372/45 |

OTHER PUBLICATIONS

Kuramoto, M. (1999). "Room–Temperature Continuous–Wave Operation of InGaN Multi–Quantum–Well Laser Diodes Grown on an n–GaN Substrate with a Backside n–Contact," *Jpan. J. Appl. Phys.* 38(Part 2, No. 2B):L184–L186.

* cited by examiner

*Primary Examiner*—Paul Ip
*Assistant Examiner*—Dung T Nguyen
(74) *Attorney, Agent, or Firm*—Morrison & Foerster LLP

(57) ABSTRACT

A semiconductor laser device includes an n-GaN substrate as a first semiconductor layer, a layered lump of hexagonal nitride-based semiconductor layers provided as a second semiconductor layer on an upper side of the first semiconductor layer, a mirror end face formed by cleavage such that both of the n-GaN substrate and layered lump have their side surfaces exposed on the approximately same plane, and a buffer layer provided between the n-GaN substrate and the layered lump. On the mirror end face, the value of an average roughness of an exposed portion of the layered lump is a half or lower compared to an average roughness of an exposed portion of the n-GaN substrate.

11 Claims, 21 Drawing Sheets

SEMICONDUCTOR LASER DEVICE AND METHOD OF MANUFACTURING THE SAME

BACKGROUND OF THE INVENTION

1. Field of the Invention

The present invention relates to a semiconductor laser device formed by a gallium nitride-based semiconductor, and to an optical information reproducing apparatus using the same.

2. Description of the Background Art

In recent years, a semiconductor laser device that emits light in a range from a blue region to an ultraviolet region has been prototyped using a nitride-based semiconductor material represented by GaN, InN, AlN and a mixed crystal thereof. FIG. 19 shows a nitride semiconductor laser device oscillating at a wavelength of 405 nm, which was reported by Masaru Kuramoto et al. in Japanese Journal of Applied Physics vol. 38 (1999), pp. L184–L186.

A semiconductor laser device 500 has hexagonal nitride-based semiconductor layers (hereinafter referred to as a "layered lump") 12 formed on an n-GaN substrate 10 (film thickness of 100 μm). Layered lump 12 is constituted by an n-$Al_{0.07}Ga_{0.93}N$ lower clad layer (film thickness of 1 μm), an n-GaN lower guide layer (film thickness of 0.1 μm), an $In_{0.2}Ga_{0.8}N$ (film thickness of 3 nm)/$In_{0.05}Ga_{0.95}N$ (film thickness of 5 nm)-3 quantum well active layer, a p-$Al_{0.19}Ga_{0.81}N$ evaporation preventing layer (film thickness of 20 nm), a p-GaN upper guide layer (film thickens of 0.1 μm), a p-$Al_{0.07}Ga_{0.93}N$ upper clad layer (film thickness of 0.5 μm), and a p-GaN contact layer (film thickness of 0.05 μm) that are layered in this order. Moreover, a positive electrode 14 and a negative electrode 15 are formed at the top and bottom sides of the layered lump, respectively. A mirror end face 400 is formed by a conventional cleaving method, which will be described later in detail. Furthermore, a stripe optical waveguide 13 is provided within layered lump 12, and serves to guide laser light. Semiconductor laser device 500 has a waveguide structure in which an active layer and a guide layer are interposed between clad layers. Thus, light emitted at the active layer is trapped into the waveguide structure, and the mirror end face functions as a laser cavity mirror, generating laser oscillating operation.

Mirror end face 400 is manufactured by the conventional cleaving method, for example, as described below. FIG. 20 illustrates the conventional cleaving method, showing an enlarged plan view of a substantial part of a wafer 121 in which hexagonal gallium nitride-based semiconductors are layered with a required layer structure on n-GaN substrate 10.

First, wafer 121 is prepared in which hexagonal gallium nitride-based semiconductors are layered with a required layer structure on an n-GaN substrate 10, and positive electrode 14 is formed. At a peripheral portion on the surface of wafer 121 (a surface opposite to n-GaN substrate 10), a groove 122 having a length of approximately 0.1 to a few millimeters is formed in a direction parallel to a cleavage plane which is unique to the material of a hexagonal nitride-based semiconductor. Here, the groove is formed by dicing or scribing, and specifically, a (1-100) plane is selected as the cleavage plane of the semiconductor layer described above.

Next, an external force is applied to n-GaN substrate 10 to divide wafer 121 into pieces in the direction parallel to the cleavage plane unique to the hexagonal nitride-based semiconductor, to obtain a plane which is to be mirror end face 400 of semiconductor laser device 500 (see FIG. 19). Here, a cleavage line 123 presents an issue. Details will be described later.

The semiconductor laser device according to the conventional technique described above has the problems as indicated below.

[Problem 1] Effects by Substrate-Side End face

Inventors of the present invention fabricated the semiconductor laser device according to the above-described conventional technique, to find one or two in every ten semiconductor laser devices that oscillate at two different wavelengths. FIG. 21 shows an oscillation spectrum of a semiconductor laser device oscillated at two different wavelengths. While vertical multimode oscillation occurred in the vicinity of threshold current, an envelope shaped by each peak is bimodal. This means that, in addition to a peak group 131 of a plurality of vertical modes around a primary oscillation wavelength, another peak group 132 of a plurality of vertical modes has occurred around a point a little toward a longer wavelength side or a shorter wavelength side. In FIG. 21, location of peak group 132, whether it is on the longer wavelength side or on the shorter wavelength side with respect to peak group 131, is not constant for each device. Peak group 132 may be located on a longer wavelength side in one semiconductor laser device, whereas it may be located on the shorter wavelength side in a different semiconductor laser device fabricated in the same lot.

The inventors of the present invention examined and found that this was due to a leaking mode to the n-GaN substrate in some ways, and proved that the leakage mode was caused by oscillation light generated within the cavity formed by a pair of n-GaN substrate portions on the mirror end face (hereinafter referred to as "substrate-side end faces").

Thus, even with semiconductor laser devices formed in the same lot, a ratio of the length of a cavity constituted by a pair of substrate-side end faces to the length of a cavity constituted by a pair of the layered lump portions on the mirror end face (hereinafter referred to as "layered-lump-side end faces"). Thus, relative positions of peak group 131 and peak group 132 in FIG. 21 may be different in each device. In the present specification, laser light oscillated at a wavelength different from the primary wavelength is referred to as a "substrate leaking mode."

Threshold current of the substrate leaking mode is somewhat higher than that of the primary laser oscillation mode, resulting in nonlinear I-L property of the semiconductor laser, which is undesirable in operation of the semiconductor laser device. Moreover, the substrate leaking mode emits light in the same direction as that of the primary oscillation light, which makes it impossible to separate the substrate leaking mode from the primary laser light in a spatial sense. Therefore, when such a laser device is mounted to an optical information reproducing apparatus such as an optical pickup, noise may be caused, resulting in lowering of an SIN ratio.

[Problem 2] Deterioration in Flatness of Mirror End Face

The inventors of the present invention fabricated the semiconductor laser device according to the conventional technique, and failed in some cases to obtain a good cleavage plane on the mirror end face. On mirror end face 400 of semiconductor laser device 500 shown in FIG. 19 produced according to the conventional technique, a number of vertical streaks 16 were observed within layered lump 12 of hexagonal nitride-based semiconductors, including the portion of optical waveguide 13. When observed in detail, it was found that vertical streaks 16 were concavities and convexities, i.e. surface roughness, generated across a region extending from the lower surface of n-GaN substrate 10 to the upper surface of layered lump 12. The size of each streak is evaluated along a line perpendicular to the direction of layering (the left to right direction in FIG. 19), and a RMS (Root Mean Square) value of approximately 1 to 6 nm along the length of 4 μm is obtained. Three to ten such semiconductor laser devices were observed in every ten devices. Though the cause thereof is unknown, it can be interpreted as follows.

The inventors of the present invention examined and evaluated the n-GaN substrate by XRD (X-Ray Diffraction), to find that a half band width of a peak indicating the <0001> direction was approximately four minutes, which bears comparison with the GaN film grown by a normal MOCVD Metal Organic Chemical Vapor Deposition) device, whereas a half band width of the peak indicating the <1-100> direction was approximately 12 minutes, which was significantly large compared to the value with the GaN film (approximately 6 minutes) grown by the normal MOCVD device. Thus, it can be said that there are many n-GaN substrates that are insufficient in their a-axis orientation, and therefore cleaving of an n-GaN substrate would not result in a flat cleaved mirror end face, generating a number of vertical streaks. Furthermore, the layered lump of hexagonal nitride semiconductors is directly formed on the surface of an n-GaN substrate in the conventional semiconductor laser device, so that stress from the n-GaN substrate is propagated to the layered lump when the mirror end face of the semiconductor laser is formed by the conventional cleaving method, preventing flat cleaving. This is considered to be a cause of deterioration in flatness on the layered lump side of the mirror end face.

Moreover, when the surface of the n-GaN substrate was observed by a cathode luminescence measurement, a number of dark points or dark lines were found scattered on the surface. These indicate crystalline defects distributed on the substrate surface, which occurred at alleviation of a residual stress applied when the substrate surface was finished by mechanical polishing. In substrates of other materials, for example, in a GaAs substrate, isotropic chemical etching is performed using an etchant on the substrate surface after mechanically polished, so as to remove the residual stress applied from the substrate surface to the depth of several tens of microns. Whereas, an appropriate etchant is absent in the n-GaN substrate, resulting in incomplete removal of the residual stress applied from the substrate surface to the depth of several tens of microns. Such a layer in which the residual stress is applied through the depth of several tens of microns from the substrate surface will be referred to as a "residual stress layer." In the residual stress layer, a cleavage plane that is unique to the hexagonal nitride-based semiconductor is present, which however forms a curved surface with a warp due to the residual stress, rather than a flat surface. When a wafer is fabricated by directly forming a layered lump of hexagonal nitride-based semiconductors on the surface of a substrate including such a residual stress layer near the substrate surface, the layers in the wafer are arranged in the order of, from the substrate surface, the layered lump, the residual stress layer and the n-GaN substrate. When such a wafer is cleaved, a cleavage plane unique to the hexagonal nitride-based semiconductor is warped between the layered lump and the n-GaN substrate. This is also considered as a cause of the failure in obtaining a flat cleaved end face on the layered-lump side.

As such, according to the conventional technique, only a surface with roughness could be obtained despite of the mirror end face formed in parallel with the cleavage plane unique to the hexagonal nitride-based semiconductor. This causes not only variation in the device property such as a threshold or differential efficiency due to variation of a mirror reflectance, but also deterioration in the optical property due to irregularity on a light emitting plane such that FFP (Far Field Pattern) does not form a smooth unimodal shape, resulting in split peaks or a ripple. Such an abnormality in FFP is undesirable since it would cause, particularly in an application to an optical pickup and the like, insufficient convergence or, in an extreme case, stray light.

Furthermore, cracks or roughness on the mirror end face tends to occur on an upper surface side (the layered lump side, not on the n-GaN substrate side). Because the resistance of a p-side clad layer is high in a nitride-based semiconductor laser device, an active layer is located very close to the surface in order to reduce the device voltage, and the depth of the active layer is generally equal to or lower than 1 μm. The fact that the cracks or roughness likely occur on the upper surface side means that the waveguide portion may be affected with high chances, lowering the yield in manufacturing of devices.

[Problem 3] Linearity of Cleavage Line

The inventors of the present invention fabricated the semiconductor laser device according to the above-described conventional technique, to find a number of polygonal cleavage lines 123, as shown in FIG. 20, extending in directions different from a desired direction. Though the cause thereof is unknown, it can be interpreted as described below.

When layered lump 12 of hexagonal gallium nitride-based semiconductors having a required layer structure is grown on n-GaN substrate 10, roughness of concavities and convexities each having a shape of a six-sided pyramid are formed on the surface of layered lump 12. Specific measurements showed that the average surface roughness (i.e. concavities and convexities) across a region extending for the length of 1 mm in the direction of a surface perpendicular to the layering direction is Ra approximately 400 to 500 Å. Such roughness is formed when a residual stress layer is present near the surface of the n-GaN substrate. When a wafer on which such roughness occurred is cleaved by the conventional cleaving method, cleavage line 123, which is supposed to be a straight line parallel to the left-to-right direction in FIG. 20, is cleaved bending at an angle of approximately 60 degrees with respect to the straight line, affected by the roughness on the surface of the layered lump. As a result, the cleavage line extends in a direction different from a desired direction.

Such a condition in which a polygonal cleavage line is easily formed causes a problem in that the mirror end face of the semiconductor laser device is inclined rather than being perpendicular to the substrate surface. This also means that the mirror end face is not perpendicular to the stripe of the optical waveguide, causing raise in the threshold current and variation of laser light emitting direction due to lowering of light reflectance on the mirror end face, resulting in a lowered yield in manufacturing of devices. In addition, even if the mirror end face happens to be perpendicular to the stripe of the optical waveguide, variation still occurs in the length of the optical cavity, causing variation of threshold current or operation voltage, also resulting in a lowered yield in manufacturing of devices.

The present invention is directed to solve the problems 1 to 3 described above, to provide a nitride semiconductor laser device optimal for an application to a light pick-up and the like with a good yield, and to realize an optical information reproducing apparatus having a superior light condensing property.

SUMMARY OF THE INVENTION

In order to achieve the objects described above, according to one aspect of the present invention, a semiconductor laser device includes a first semiconductor layer including a gallium nitride substrate; a second semiconductor layer including a hexagonal nitride-based semiconductor, having an active layer and provided on an upper side of the first semiconductor layer; and mirror end face formed by cleavage such that both of the first semiconductor layer and the second semiconductor layer have side surfaces exposed onto an approximately same plane. An average roughness of an exposed portion of the second semiconductor layer is at most a half of an average roughness of an exposed portion of the first semiconductor layer, on the mirror end face.

The structure above allows a reflectance to be lower in the region on the first semiconductor layer side compared to that in the region on the second semiconductor layer side, on the mirror end face formed by cleaving, so that a substrate leaking mode can be suppressed. Particularly, in order to suppress the substrate leaking mode and to form a unimodal envelope shaped by a vertical mode peak of an oscillation spectrum, the measurement value on the second semiconductor layer side end face must be at most a half of the measurement value on the first semiconductor layer side end face when compared for RMS of roughness across a region extending for 4 μm in the direction perpendicular to the layering direction. The above structure satisfies the condition, so that the envelope can have the unimodal shape.

Preferably, the semiconductor laser device further includes a buffer layer provided between the first semiconductor layer and the second semiconductor layer. By such a configuration that the buffer layer is interposed, cleaving of the second semiconductor layer side is independently performed, unaffected by the stress at cleaving of the first semiconductor layer side, so that a highly flat plane with few streaks can be obtained, and thus a precise semiconductor device with reduced variation in reflectance and few cracks can easily be manufactured. Furthermore, with the buffer layer interposed between the first semiconductor layer, the surface of the second semiconductor layer, when layered, is unaffected by the residual stress layer on the surface of the semiconductor layer, so that occurrence of the surface roughness on the second semiconductor layer can be suppressed. As a result, the second semiconductor layer can be prevented from being cleaved in an undesired direction due to effects of surface roughness, facilitating manufacturing of a semiconductor device that is accurately cleaved in the right direction.

Preferably, the buffer layer includes $In_xAl_yGa_{1-x-y}N$ ($0 \leq x \leq 1$, $0 \leq y \leq 1$). Such an structure allows the use of the same nitride semiconductor as that of an upper and lower semiconductor layers, so that the resistance of the buffer layer can be reduced. Moreover, the difference in thermal expansion coefficients between the buffer layer and the upper and lower adjacent semiconductor layers can also be reduced, so that the reliability of the semiconductor layer device can be improved.

Preferably, the thickness of the buffer layer is at least 10 nm and at most 10 μm. The structure allows an average surface roughness Ra to be 100 Å or lower when a layered lump of hexagonal nitride-based semiconductors is formed on the buffer layer as the second semiconductor layer.

Preferably, the second semiconductor layer includes a linearly formed optical waveguide, the gallium nitride substrate has a linear recess on an upper surface of the gallium nitride substrate, and the optical waveguide is arranged so as to be located above the recess. By such a structure, the second semiconductor layer grows in sequence, affected by the stepped shape of the recess, so that effects of crystalline defects of the first semiconductor layer cannot be exerted on the optical path located above the recess, reducing crystalline defects in the optical path.

According to another aspect of the present invention, a method of manufacturing a semiconductor laser device of the present invention includes a buffer growing step growing a buffer layer on an upper side of a gallium nitride substrate at a first temperature; an upper side semiconductor growing step growing a hexagonal nitride-based semiconductor layer on an upper side of the buffer layer at a second temperature higher than the first temperature, to obtain a wafer; and a wafer dividing first step dividing the wafer along a plane parallel to a cleavage plane of the hexagonal nitride-based semiconductor layer, to obtain a wafer piece.

By employing the method, even with insufficient a-axis orientation of the gallium nitride substrate, the buffer layer can suppress propagation of effects of the stress from the gallium nitride substrate to the hexagonal nitride-based semiconductor layer at dividing of a wafer into wafer pieces by cleaving, so that a divided wafer piece with a flat cleavage plane can be obtained at least in a region on the side of the hexagonal nitride-based semiconductor layer. Therefore, when the cleavage plane is to be a mirror plane, the portion of the hexagonal nitride-based semiconductor layer can be a flat mirror end face, and thus a cavity structure having a high reflectance can be obtained.

Preferably, the wafer dividing first step includes a first groove forming step forming a groove extending in a dividing direction at an end of a surface on the hexagonal nitride-based semiconductor layer side of the wafer, before dividing the wafer. Such a method allows cleaving to be generated in a desired direction on the second semiconductor layer by forming a groove of a limited length, so that the resulting mirror plane can have a required roughness.

Preferably, the method of manufacturing a semiconductor laser device further includes a wafer dividing second step dividing the wafer piece along a plane non-parallel to the cleavage plane of the hexagonal nitride-based semiconductor layer. By the method, the semiconductor laser device can be obtained by dividing the wafer piece, and the obtained semiconductor laser device can set its cleavage plane as a mirror end face, facilitating attainment of a cavity structure having a high reflectance.

Preferably, the wafer dividing second step includes a second groove forming step forming a groove extending in a dividing direction so as to traverse a surface on a gallium nitride substrate side of the wafer piece from one end to the other end, before dividing the wafer piece. The method allows linear dividing at a desired position.

According to a further aspect of the present invention, an optical information reproducing apparatus includes any one of the semiconductor laser devices described above as a light source, and converts reflection light of laser light emitted from the light source onto an optical disk having an information recording plane, to reproduce information recorded on the optical disk. By such a structure, a semiconductor laser device with a flat mirror end face on the second semiconductor layer side, i.e. on the layered lump side, and with a good FFP is used, so that light can be condensed onto the information recording plane of the optical disk with high resolution. Moreover, as a semiconductor laser device is used in which oscillation of the substrate leaking mode is suppressed so that the envelope shaped by the vertical mode peak of an oscillation spectrum is unimodal, information can be read at a low bit error rate from the optical disk on which information is recorded with high density.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First, terms used in the present specification will be defined.

In the present specification, a "hexagonal nitride-based semiconductor" is a compound semiconductor having a hexagonal structure primarily consisting of a group III element and an N element, and includes $Al_xIn_yGa_{1-x-y}N$ ($0 \leq x-y \leq 1$), a crystal with a hexagonal structure in which a part of the group III element (at most approximately 20%) is substituted by another element, and a crystal with a hexagonal structure in which a part of the N element (at most approximately 20%) is substituted by another element.

In the present specification, a "cleavage plane unique to a hexagonal nitride-based semiconductor" is specifically a (0001) plane, a (11-20) plane or a (1-100) plane, from which the (1-100) plane is preferably selected.

In the present specification, a "layered lump of hexagonal nitride-based semiconductors" indicates a conventional layer structure constituting a semiconductor laser device, and specifically, indicates a portion of the entire layer structure from the n-GaN layer to the p-GaN contact layer except for a "buffer layer" which will be described later.

In the present specification, an "average value Ra of surface roughness" of a layered lump of hexagonal nitride-based semiconductors indicates a value measured by a step measurement instrument (DEKTAK3ST from Veeco-Sloan Technical Division), representing an average value obtained from 1000 measurement points across a region extending for the length of 1 mm. Here, a stylus pressure is 30 mg and a scanning speed is 80 μm/seconds.

In the present specification, "RMS (Root Mean Square) of the surface roughness across a region extending for the length of 4 μm" or simply an "average of roughness" indicates a value measured by a scanning probe microscope (Dimension 3100 series from Digital Instruments), representing an average value obtained from 200 measurement points across a region extending for the length of 4 μm. Here, a scanning field has the size of 10 μm×10 μm, and a scanning rate is 1 Hz.

First Embodiment

Figure 1:
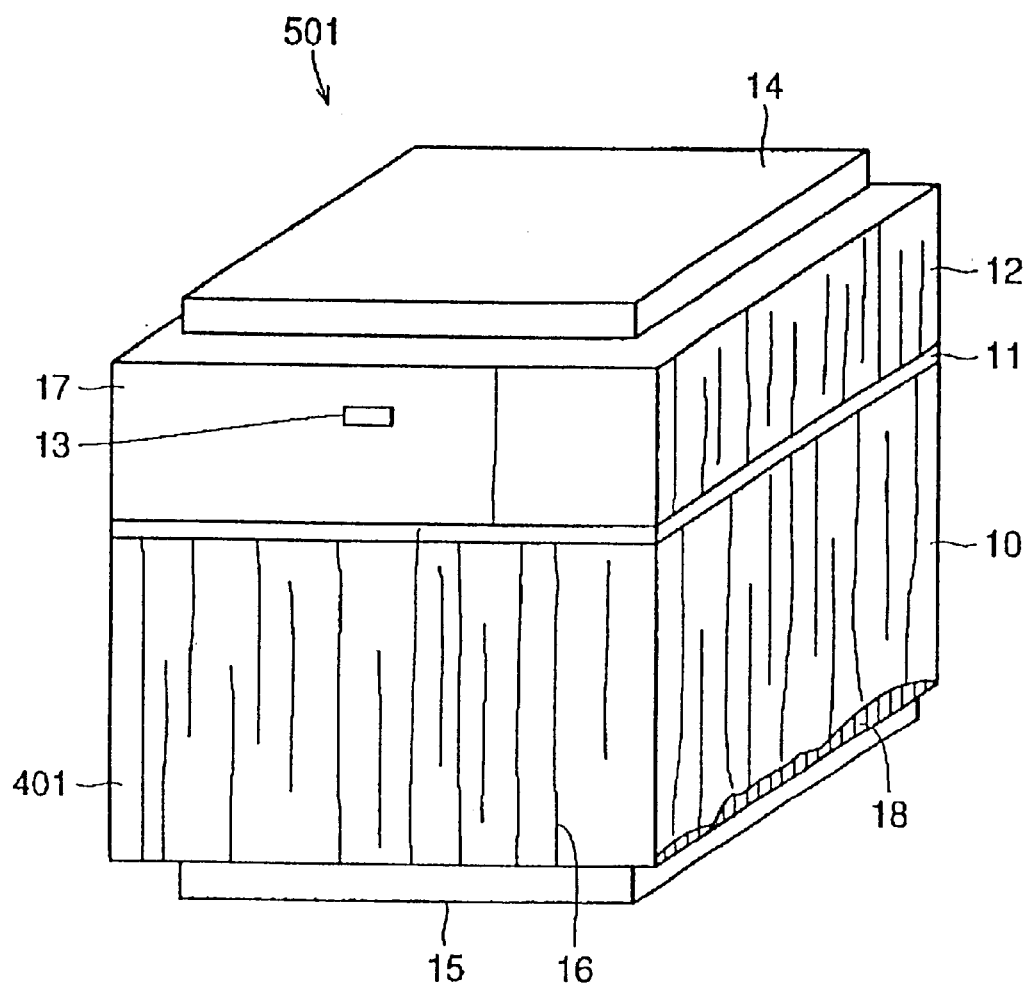
FIG. 1 is a perspective view of a semiconductor laser device according to the first embodiment of the present invention.

Referring to FIG. 1, the structure of a semiconductor laser device 501 according to the first embodiment of the present invention will be described.

An n-GaN substrate 10 is a substrate including n-GaN whose (0001) plane grows as a surface for crystal growth, on which a layered lump 12 of hexagonal nitride-based semiconductors is formed with a buffer layer 11 interposed. A mirror end face 401 is formed in parallel with the (1-100) plane. A stripe optical waveguide 13 is provided within layered lump 12 and serves to guide laser light. A positive electrode 14 is provided on the upper surface of layered lump 12, and a negative electrode 15 is provided on the lower surface of the n-GaN substrate. Positive electrode 14 and negative electrode 15 are for externally supplying power when semiconductor laser device 501 is in operation. A grooving portion 18 that can be found at a lower end of a side surface of n-GaN substrate 10 is a trace of a groove provided on the lower surface of a wafer piece (which will later be the lower surface of n-GaN substrate 10) for dividing the wafer piece into individual semiconductor laser devices 501. The groove is formed by scribing, and is perpendicular to the (1-100) plane of layered lump 12. A number of vertical streaks 16 can be seen on the n-GaN substrate 10 side on mirror end face 401. Whereas, the layered lump 12 side on mirror end face 401 is formed as a flat region 17 having few vertical streaks. An end face of stripe optical waveguide 13 exposed to mirror end face 401 appears within flat region 17.

Figure 2:
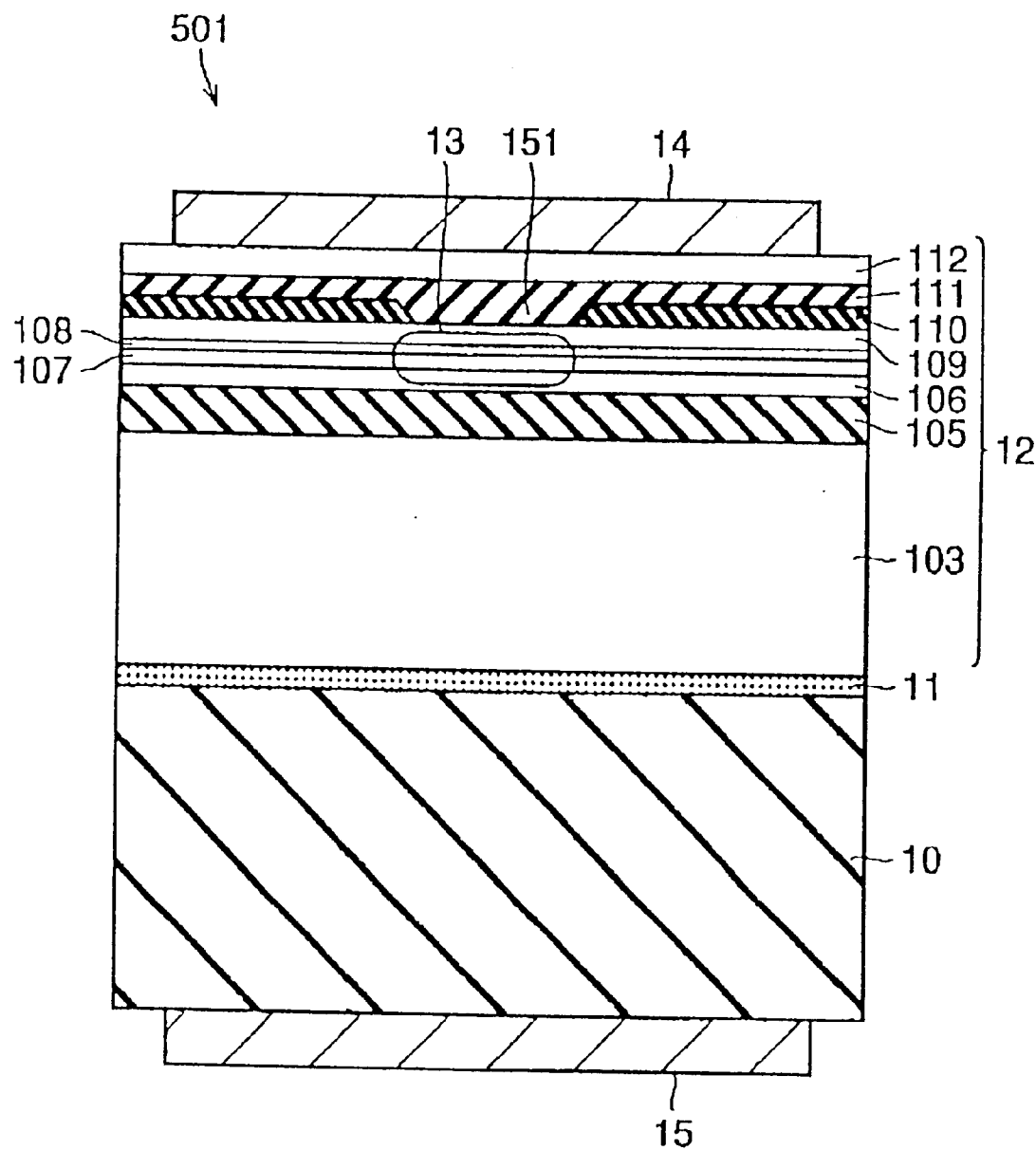
FIG. 2 illustrates a layered lump of the semiconductor laser device according to the first embodiment of the present invention.

Referring to FIG. 2, each layer exposed to mirror end face 401 of semiconductor laser device 501 will be described in more detail. FIG. 2 is a front view of mirror end face 401, particularly showing the detailed structure of layered lump 12 of hexagonal nitride-based semiconductors. However, for the sake of simplicity, FIG. 2 shows no roughness on mirror end face 401, such as vertical streaks 16 that were significantly shown in FIG. 1.

Layered lump 12 includes, a buffer layer 11 (film thickness of 100 nm), an n-GaN contact layer 103 (film thickness of 4 μm), an n-AlGaN/GaN superlattice clad layer 105 (film thickness of 800 nm), an n-GaN optical guide layer 106 (film thickness of 100 nm), an InGaN multiple quantum well active layer 107 (emission wavelength of 405 nm), a p-AlGaN evaporation preventing layer 108 (film thickness of 18 nm), a p-GaN optical guide layer 109 (film thickness of 100 nm), an n-AlGaN/GaN superlattice block layer 110 (film thickness of 400 nm), a p-AlGaN/GaN superlattice clad layer 111 (film thickness of 800 nm), and a p-GaN contact layer 112 (film thickness of 100 nm), which are layered in this order from the n-GaN substrate 10 side. The n-AlGaN/GaN superlattice block layer 110 is provided with a linear opening 151 extending in the cavity direction, such that current flowing between positive electrode 14 and negative electrode 15 is injected into n-InGaAlN multiple quantum well active layer 108 through this opening 151. In addition, n-AlGaN/GaN superlattice block layer 110 is selected to have a structure with a refractive index lower than that of p-AlGaN/GaN superlattice clad layer 111. Thus, a linear optical waveguide 13, which is an oscillation region of laser light, is formed in a region near InGaN multiple quantum well active layer 107 corresponding to opening 151. Layered lump 12 collectively indicates the layered structure between n-GaN contact layer 103 and p-GaN contact layer 112.

On mirror end face 401 in semiconductor laser device 501 according to the present embodiment, RMS of the roughness across a region extending for the length of 4 μm in the direction perpendicular to the layered direction is 1 to 10 nm on the n-GaN substrate 10 side, whereas the RMS is at most 0.1 nm on the layered lump 12 side, the latter being a half or less of the former.

Next, a method of manufacturing semiconductor laser device 501 according to the present embodiment will be described with reference to FIGS. 1 and 2. It is noted that, though an n-GaN low temperature layer is used as a buffer layer in the present embodiment, the material of the buffer layer is not limited thereto.

Presenting a summary at first, a semiconductor laser device is manufactured as follows. The n-GaN substrate 10 having an area of a certain size such that a predetermined number of semiconductor laser devices can be manufactured thereon at the same time is used, and required layers are formed sequentially on the surface of the substrate 10. In addition, electrodes corresponding to each semiconductor laser device are further provided. A wafer is thus prepared first and is then divided to form individual semiconductor laser devices. Details will be described below.

First, n-GaN substrate 10 (film thickness of 100 to 500 μm) having a (0001) C plane as a surface for crystal growth is washed.

The washed n-GaN substrate 10 is carried into an MOCVD device, and cleaned in an $H_2$ atmosphere at a high temperature of approximately 1100° C. Subsequently, the temperature is lowered, and 10 nmol/min of $SiH_4$ is introduced while 10 liter/min of hydrogen ($H_2$) is fed as carrier gas, and NHs and trimethylgallium (TMG) are introduced by 5 liter/min and by 20 mol/min, respectively, at 600° C., to grow an n-GaN low temperature growth layer having a thickness of at least 10 nm and at most 10 μm (for example, 100 nm). The n-GaN low temperature growth layer is to be buffer layer 11.

Though the manufacturing method of n-GaN low temperature growth layer was described here as a manufacturing method of buffer layer 11, buffer layer 11 is not limited to n-GaN, and GaN with introduction of 0 mol/min of $SiH_4$, or a film including AlGaInN including Al and In may also be used without any problems. Trimethyl aluminum (TMA) may be introduced by an appropriate amount at film forming when Al is included, and trimethylindium (TMI) may be introduced by an appropriate amount at film forming when In is included.

Next, while 5 liter/min of each of $N_2$ and $NH_3$ are fed, the temperature is raised to be approximately 1050° C. When the temperature is raised, $H_2$ is used as carrier gas in place of $N_2$, 100 μmol/min of TMG and 10 nmol/min of $SiH_4$ are introduced, to grow an n-type GaN contact layer 103 to 0.1 to 10 μm (e.g. approximately 4 μm).

Thereafter, the flow rate of TMG is adjusted to 50 μmol/min, and TMA is introduced by a certain amount, to grow an n-type $Al_{x11}Ga_{1-x11}N$ layer (e.g., x11=0.2) to a thickness of 20 to 500 Å (e.g. 20 Å). Next, feeding of TMA is stopped and the n-type GaN layer is grown to 20 to 500 Å (e.g. 20 Å). This is repeated to form an n-AlGaN/GaN superlattice clad layer 105 (for example, an average composition x1=0.1, and a total film thickens of 0.8 μm) consisting of an alternate layering structure of the n-type AlGaN layer and the n-type GaN layer (n-type AlGaN layer/n-type GaN layer/n-type AlGaN layer/n-type GaN layer/ . . . /n-type GaN layer/n-type AlGaN layer). The n-AlGaN/GaN superlattice dad layer 105 may be a film consisting of any other materials having a smaller average refractive index and a larger average bandgap compared to n-GaN optical guide layer 106, and may be substituted by, for example, an n-type AlGaN layer.

When formation of n-AlGaN/GaN superalttice clad layer 105 is completed, feeding of TMA is stopped and TMG is adjusted to 100 μmol/min, to grow the n-type GaN guide layer to a thickness of 50 to 200 nm (e.g. 100 nm). Subsequently, feeding of TMG is stopped, the carrier gas is again changed from $H_2$ to $N_2$ and the temperature is lowered to 700° C. Then, a certain amount of trimethylindium (TMI) which is an raw material of indium and 15 μmol/min of TMG are introduced, to grow a barrier layer consisting of $In_vGa_{1-v}N$. Thereafter, feed of TMI is increased to a certain amount, to grow a well layer consisting of $In_wGa_{1-w}N$. This is repeated to form an InGaN multiple quantum well active layer 107 consisting of an alternate layering structure of the InGaN barrier layer and the InGaN well layer (barrier layer/well layer/barrier layer/well layer/ . . . /well layer/barrier layer). The crystal mixture ratio of InGaN forming the barrier and well layers and the film thickness of the layers are designed such that the radiation wavelength is in the range between 370 and 430 nm, and the flow rate of TMI introduced at growth is adjusted so that a film of an In composition corresponding to the design value can be obtained. The number of layers in the well layer is preferably 2 to 6, and more preferably 3. When formation of InGaN multiple quantum well active layer 107 is completed, feeding of TMI and TMG are stopped, and the temperature is again raised to 1050° C. Then, the carrier gas is again changed from $N_2$ to $H_2$, and 50 μmol/min of TMG, an appropriate amount of TMA and 10 nmol/min of biscyclopentadienyl magnesium ($Cp_2Mg$) which is a low material for p-type doping are introduced, to grow a p-$Al_zGa_{1-z}N$ ($0 \leq z \leq 0.3$) evaporation preventing layer 108 having a thickness of 0 to 20 nm. When the growth of p-AlGaN evaporation preventing layer 108 is completed, feeding of TMA is stopped and the feed of TMG is adjusted to 100 pmol/min, to grow a p-GaN optical guide layer 109 having a thickness of 50 to 200 nm (e.g. 100 nm).

Subsequently, feeding of $Cp_2Mg$ is stopped, 10 μmol/min of $SiH_4$ is introduced, the feed of TMG is adjusted to 50 μm/min, and a certain amount of TMA is introduced, to grow 20 to 500 Å (e.g. 20 Å) of an n-type AlGaN layer. Next, feeding of TMA is stopped to grow an n-type GaN layer to 20 to 500 Å (e.g. 20 Å). This is repeated to grow 0.1 to 0.8 μm (e.g. 0.4 μm) of n-$Al_yGa_{1-y}N$ ($0.1 \leq y \leq 0.3$)/GaN superlattice block layer 110 consisting of an alternate layering structure of the n-type AlGaN layer and n-type GaN layer (n-type AlGaN layer/n-type GaN layer/n-type AlGaN layer/n-type GaN layer/ . . . /n-type GaN layer/n-type AlGaN layer). The n-AlGaN/GaN superlattice block layer 110 may be any layer having a smaller average refractive index compared to those of p-GaN optical guide layer 109 and p-AlGaN/GaN superlattice clad layer 111 and having a larger average bandgap compared to that of p-GaN optical guide layer 109, and may be substituted by, for example, an n-type AlGaN block layer. When formation of n-AlGaN/GaN superlattice block layer 110 is completed, feeding of TMA, TMG and $SiH_4$ are stopped and the temperature is lowered, and the substrate is taken out from the MOCVD device at a room temperature.

Next, a stripe opening 151 having a width of 3 μm is provided on n-AlGaN/GaN superlattice block layer 110 using the conventional photolithography technique and Reactive Ion Etching (RIE) technique. The stripe is arranged to be in parallel with the <11-20> direction.

Subsequently, the wafer is again carried into the MOCVD device, the temperature is raised to 1050° C., a certain amount of $Cp_2Mg$ is introduced, the feed of TMG is adjusted to 50 μm/min, and a certain amount of TMA is introduced to grow 20 to 500 Å (e.g. 20 Å) of a p-type AlGaN layer. Next, feeding of TMA is stopped, to grow 20 to 500 Å (e.g. 20 Å) of a p-type GaN layer. This is repeated to form a p-type $Al_yGa_{1-y}N$ ($0.1 \leq y \leq 0.3$)/GaN superlattice clad layer 111 consisting of an alternate layering structure of the p-type AlGaN layer and p-type GaN layer (p-type AlGaN layer/p-type GaN layer/p-type AlGaN layer/p-type GaN layer/ . . . p-type GaN layer/p-type AlGaN layer), having a thickness of at least the thickness of the block layer and at most 10 μm (e.g. 0.8 μm). The p-AlGaN/GaN superlattice clad layer 111 may be any layer having an average refractive index in a range between that of p-GaN optical guide layer 109 and that of the n-AlGaN/GaN superlattice block layer and having an average bandgap larger than that of p-GaN optical guide layer 109, and may be substituted by, for example, a p-type AlGaN clad layer.

Finally, the feed of TMG is adjusted to 100 μmol/min and feeding of TMA is stopped, to grow a p-GaN contact layer 112 having a thickness of 0.01 to 10 μm (e.g. 0.1 μm), and the growth of the light emitting device structure is terminated. When the growth is terminated, feeding of TMG and $Cp_2Mg$ are stopped and the temperature is lowered, and the substrate is taken out from the MOCVD device at a room temperature.

The flatness of the wafer surface is measured here, and an average value of the surface roughness of Ra=100 Å or lower is obtained.

Subsequently, positive electrode 14 is formed across a nearly entire surface of p-GaN contact layer 112. For a material of positive electrode 14, for example, Au/Ni or Au/Pd may be used. Moreover, negative electrode 15 is formed across a nearly entire surface of the back side of n-GaN substrate 10. For a material of negative electrode 15, for example, Al/Ti or Au/W may be used.

The method of forming the semiconductor laser device structure described above is similar to a common method except for provision of buffer layer 11.

Next, the first step of wafer dividing (a cleaving step), in which the present wafer is divided to produce an end face which is to be a cavity mirror, will be described in detail with reference to FIG. 3.

Wafer 31 is constituted by n-GaN substrate 10 on which layered lump 12 of hexagonal nitride-based semiconductors is formed with buffer layer 11 interposed. FIG. 3 shows an enlarged view of a substantial part of wafer 31 when viewed from the surface side, i.e. the layered lump 12 side. A plane on the back side, i.e. the n-GaN substrate 10 side of wafer 31 is polished and adjusted such that the thickness of the entire wafer 31 is in a range between approximately 60 and 150 μm. Positive electrode 14 is formed by patterning using a photolithography technique. Here, positive electrode 14 may not necessarily be patterned, and may be formed on the nearly entire surface of wafer 31. Negative electrode 15 is formed in a similar manner on the back side of wafer 31.

Subsequently, a groove 32 is formed at a part of the wafer 31 surface side by a scribing method. Groove 32 is formed by scribing the surface on the layered lump 12 side of wafer 31 while a load of approximately 15 to 80 g (preferably about 30 to 50 g) is applied to a diamond point. Here, a multiple scribing method may also be used in which the same line segment is repeatedly scribed by the diamond point. The length of groove 32 may be approximately 0.5 to 10 mm, and approximately 1 mm of groove 32 is formed here. Groove 32 is formed at a part of the wafer 31 surface side, preferably e.g. near the wafer peripheral portion. The direction of groove 32 is set to be in parallel with the A–A' direction in FIG. 3, which is in parallel with the cleavage plane unique to the hexagonal nitride-based semiconductor, and the <11-20> direction is used here. In order to easily adjust such a direction, an orientation flat may preferably be provided in advance on the (11-20) plane [parallel to the line A–A'] or the (1-100) plane [perpendicular to the line A–A'] of the original n-GaN surface 10.

Figure 4:
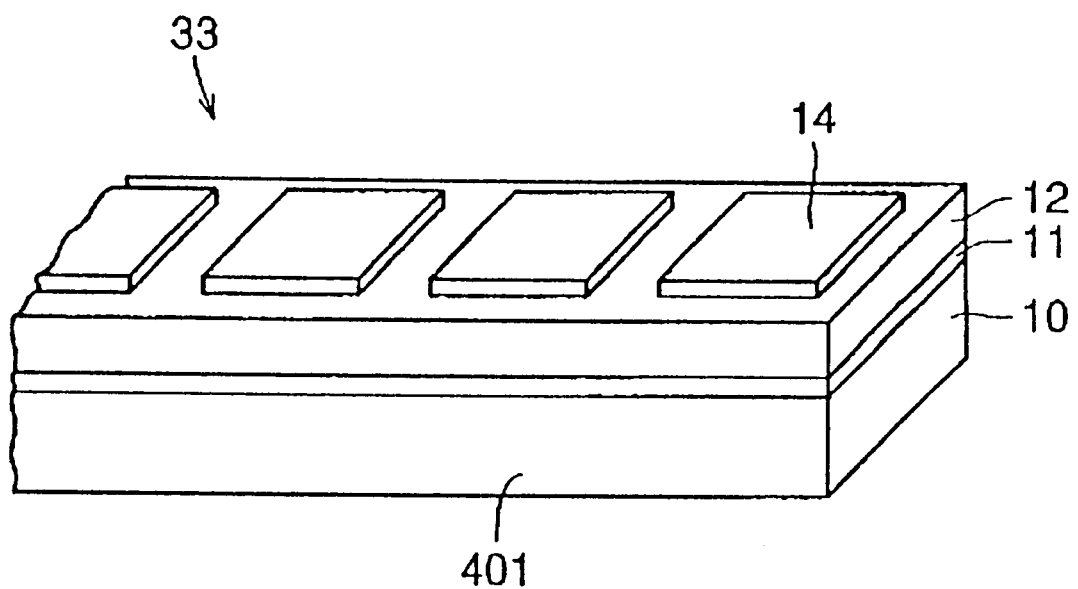
FIG. 4 is an perspective view of a wafer piece obtained in a process of the method of manufacturing the semiconductor laser device according to the first embodiment of the present invention.

Subsequently, an external force is applied to the groove 32 portion to divide the wafer. The external force may be applied by a common method, and a method in which a blade is applied from the n-GaN substrate 10 side along the groove 32 portion is used here. Alternatively, a method in which the wafer is warped by a roller or the like, or a method in which the load at scribing is increased to directly break and divide the wafer may be used. Thus, as shown in FIG. 4, a bar-like wafer piece 33 is produced and mirror end face 401 is exposed as a divided surface thereof. Wafer piece 33 includes a plurality of semiconductor laser devices 501 shown in FIGS. 1 and 2 lined from side to side.

Next, the second step of wafer dividing (a chip dividing step) in which the bar-like wafer piece 33 is divided into individual chip-like semiconductor laser devices 501 will be described in detail.

Figure 5:
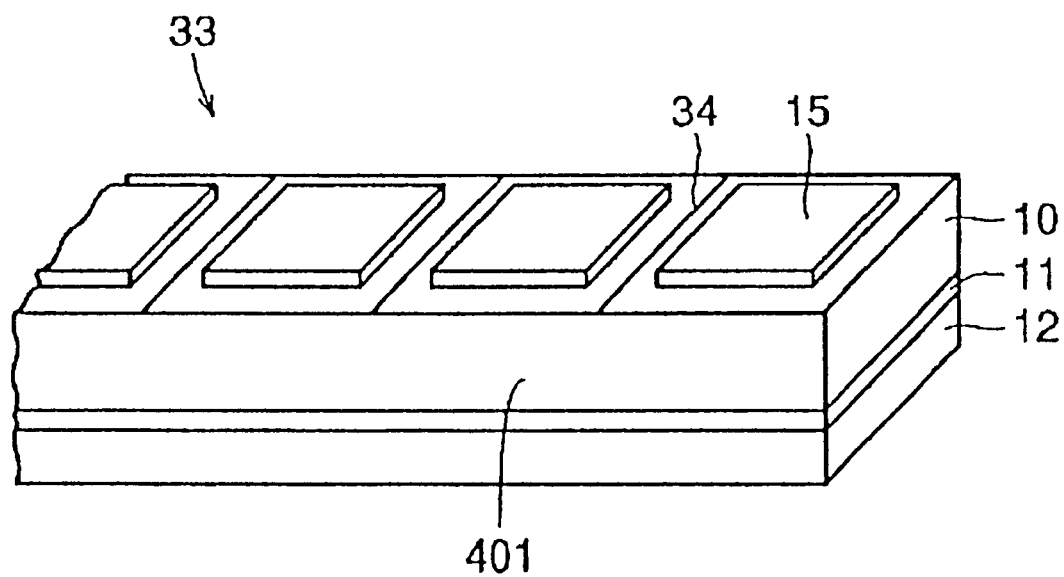
FIG. 5 is a perspective view illustrating the second step of wafer dividing included in the manufacturing method of the semiconductor laser device according to the first embodiment of the present invention.

As shown in FIG. 5, a groove 34 is formed at a part of a surface on the back side, i.e. the n-GaN substrate 10 side, of wafer piece 33 by a scribing method. Groove 34 is formed by scribing the wafer surface while a load of approximately 50 to 80 g (preferably about 60 to 70 g) is applied to a diamond point. Here, a multiple scribing method in which the same line segment is repeatedly scribed by the diamond point may also be used. In the present embodiment, the direction of groove 34 here is inclined 90 degrees from the cleavage plane unique to the hexagonal nitride-based semiconductor. That is, groove 34 is directed in the <1-100> direction, which is parallel to the B–B' direction in FIG. 3. However, the direction of groove 34 is not limited thereto, and may be any direction at least non-parallel to mirror end face 401. The length of groove 34 to be formed here may extend from end to end of the wafer, or groove 34 may be formed with the length of approximately 0.5 to 10 mm only at a portion of the back side of the wafer, for example, near the peripheral portion. However, it is preferable to form groove 34 from end to end of the wafer.

Subsequently, an external force is applied to the groove 34 portion to divide the wafer. The external force may be applied by a common method, and here, a method in which a blade is applied from the n-GaN substrate 10 side of wafer piece 33 along the groove 34 portion is used. Alternatively, a method in which wafer piece 33 is warped by a roller or the like may be used, or a method in which the load at scribing is increased to directly break and divide the wafer piece may also be used.

Through the steps described above, semiconductor laser device 501 according to the present embodiment as shown in FIGS. 1 and 2 are completed.

Figure 6:
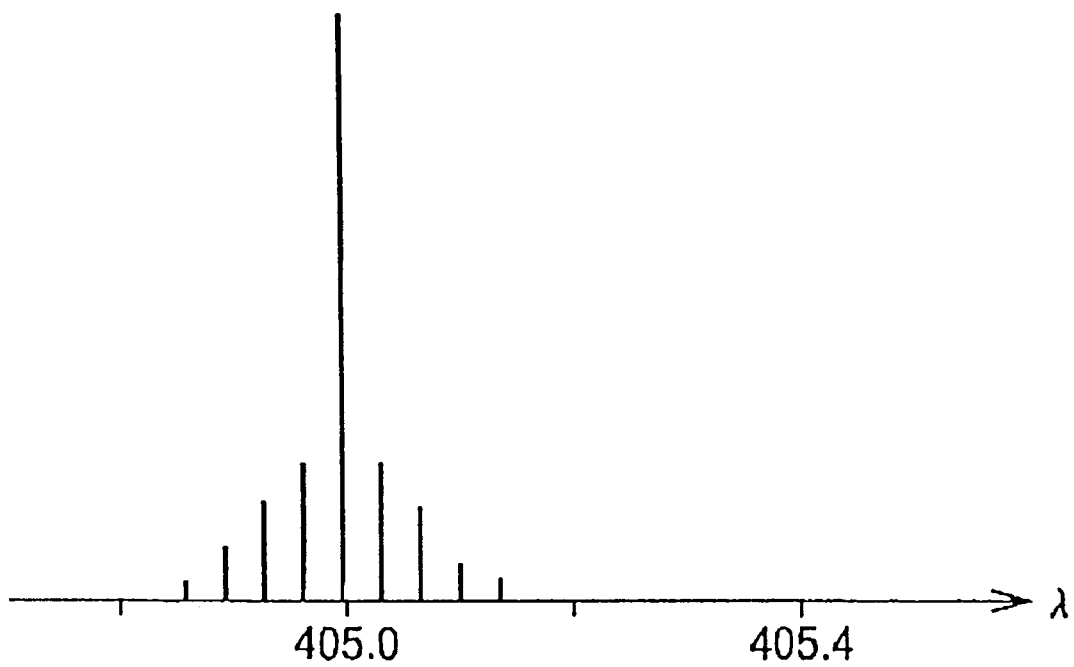
FIG. 6 is a graph showing an oscillation spectrum of the semiconductor laser device according to the first embodiment of the present invention.
Figure 21:
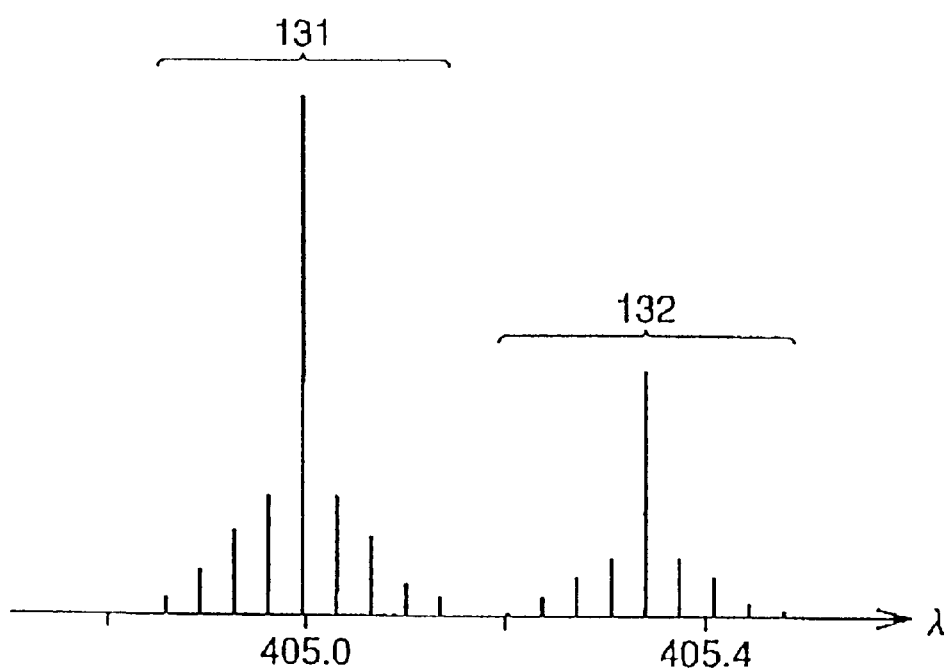
FIG. 21 is a graph showing an oscillation spectrum of the semiconductor laser device according to the conventional technique.

When power is applied to thus obtained semiconductor laser device 501 according to the present embodiment, room-temperature continues oscillation is generated at 60 mA or higher. FIG. 6 shows an oscillation spectrum in threshold current of semiconductor laser device 501 according to the present embodiment. Though a vertical multimode oscillation is generated in the vicinity of the threshold current, the envelope shaped by the top of each peak is unimodal. This is observed in all the lots fabricated as semiconductor laser device 501 according to the present embodiment. In other words, the number of semiconductor laser devices 501 showing an oscillation spectrum having a bimodal envelope shape, which was observed in the conventional semiconductor laser device as shown in FIG. 21, was zero out of ten. On mirror end face 401 of semiconductor laser device 501 according to the present embodiment, RMS of roughness across a region extending for the length of 4 µm in the direction perpendicular to the layering direction is at most 0.1 µm on the layered lump 12 side, attaining sufficient flatness, whereas RMS is increased to be in the range between 1 and 10 nm on the n-GaN substrate 10 side. This indicates that the unimodal shape of the envelope can be attained possibly because the reflectance is lowered on the end face of the n-GaN substrate 10 side due to insufficient flatness of the n-GaN substrate 10 side, and therefore the substrate leaking mode is suppressed. Thus, according to the present embodiment, the substrate leaking mode can be suppressed without the raise of the threshold current of the semiconductor laser device. Therefore, the problem 1 can be solved.

It can be found that, as for RMS of the surface roughness across a region extending for the length of 4 µm in the direction perpendicular to the layering direction, the measurement value on the layered lump side end face must be at most a half of the measurement value on the n-GaN substrate side end face, in order to suppress the substrate leaking mode and to attain the unimodal envelope shaped by the vertical mode peak of the oscillation spectrum. The condition is sufficiently satisfied in the present embodiment, so that the envelope has the unimodal shape.

Figure 7:
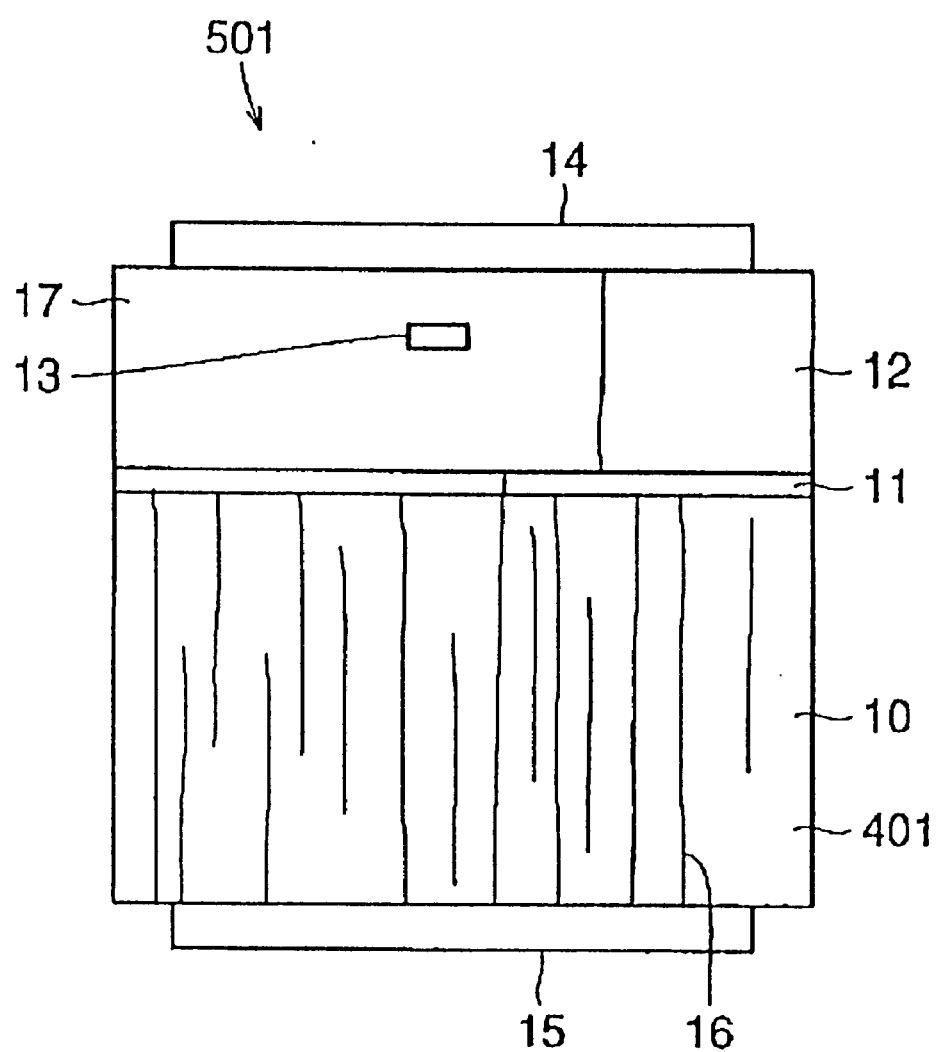
FIG. 7 is a front view of the semiconductor laser device according to the first embodiment of the present invention.

Moreover, an enlarged view of a substantial part of mirror end face 401 obtained by the method described above is shown in FIG. 7. For simplicity, the detailed structure of layered lump 12 as shown in FIG. 2 is omitted, and only optical waveguide 13 is shown in FIG. 7. A number of vertical streaks 16 can be seen on the n-GaN substrate 10 side, whereas no or few vertical streaks 16 can be seen on the layered lump 12 side. Specifically, the RMS of the roughness across a region extending for 4 µm in the direction perpendicular to the layering direction is 1 to 10 nm on the n-GaN substrate 10 side end face whereas the RMS is at most 0.1 nm on the layered lump 12 side end face. Though the exact cause thereof is unknown, a possible cause will be described below. Buffer layer 11 formed by the method described above has, in a large part thereof, a crystal structure different from the semiconductor layers on the upper and lower sides, and has no common cleavage plane to the upper and lower semiconductor layers. Thus, buffer layer 11 is divided in a manner different from that of the cleavage plane of n-GaN located on the upper and lower sides thereof. Using the method described above, though the wafer is cleaved along the cleavage plane of n-GaN substrate 10, the stress at cleaving of n-GaN substrate 10 is not transmitted to the layered lump 12 side. Therefore, layered lump 12 and n-GaN substrate 10 are cleaved individually in different manners. This results in mirror end face 401 having many vertical streaks 16 on the n-GaN substrate 10 side and having flat region 17 which is an extremely flat end face on the layered lump 12 side.

Figure 8:
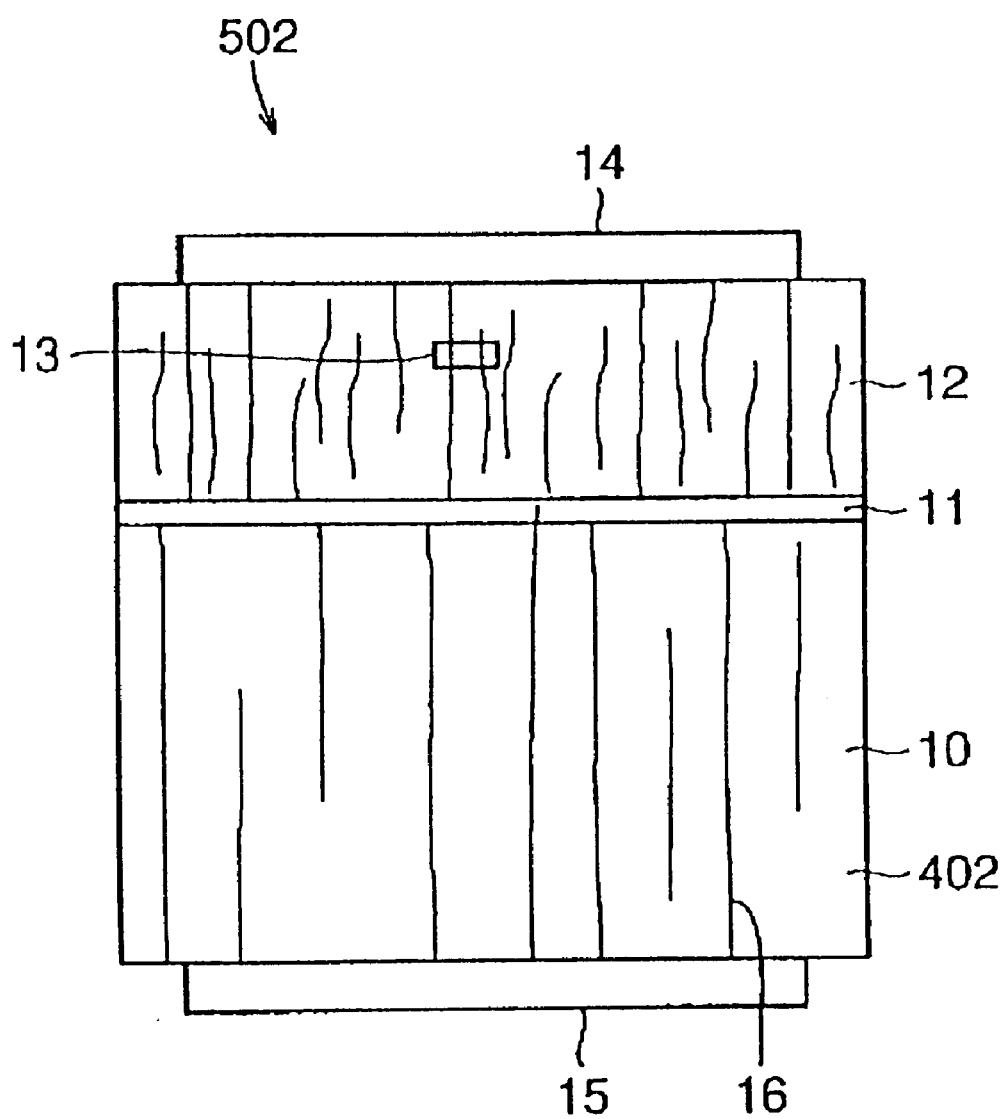
FIG. 8 is a front view of another example of a semiconductor laser device according to the first embodiment of the present invention.

Referring to FIG. 8, a semiconductor laser device 502 will be described as another example according to the present embodiment. In semiconductor laser device 501 described above, a groove is formed on the surface side, i.e. the layered lump 12 side, to divide wafer 31 into bar-like wafer pieces. Whereas, in semiconductor laser device 502, a groove is formed on the back side, i.e. the n-GaN substrate 10 side, not on the surface side, to divide wafer 31 into bar-like wafer pieces. Other conditions such as the length of the groove, the means for forming the groove, and the method of dividing the wafer into chips are the same as with the case of semiconductor laser device 501.

FIG. 8 is an enlarged view of a substantial part of mirror end face 402 of semiconductor laser device 502. Vertical streaks 16 are generated on the n-GaN substrate 10 side end face in a percentage similar to that in semiconductor laser device 501 (see FIG. 7), whereas a larger number of vertical streaks 16 are adversely generated on the layered lump 12 side end face compared to that on the n-GaN substrate 10 side. More specifically, for the surface roughness across a region extending for 4 µm in the direction perpendicular to the layering direction, RMS is 0.5 to 5 nm on the substrate side end face, whereas RMS is 1 to 20 nm on the layered lump side end face. This possibly occurs because the distance between layered lump 12 and the groove is increased due to the groove being formed on the n-GaN substrate 10 side, deflecting the stress at cleaving by the time it reaches layered lump 12 from n-GaN substrate 10.

The result indicates that it is preferable to groove a plane on the surface side, i.e. the layered lump 12 side, not on the back side, i.e. the n-GaN substrate 10 side, to divide wafer 31 into bar-like wafer pieces.

Figure 9:
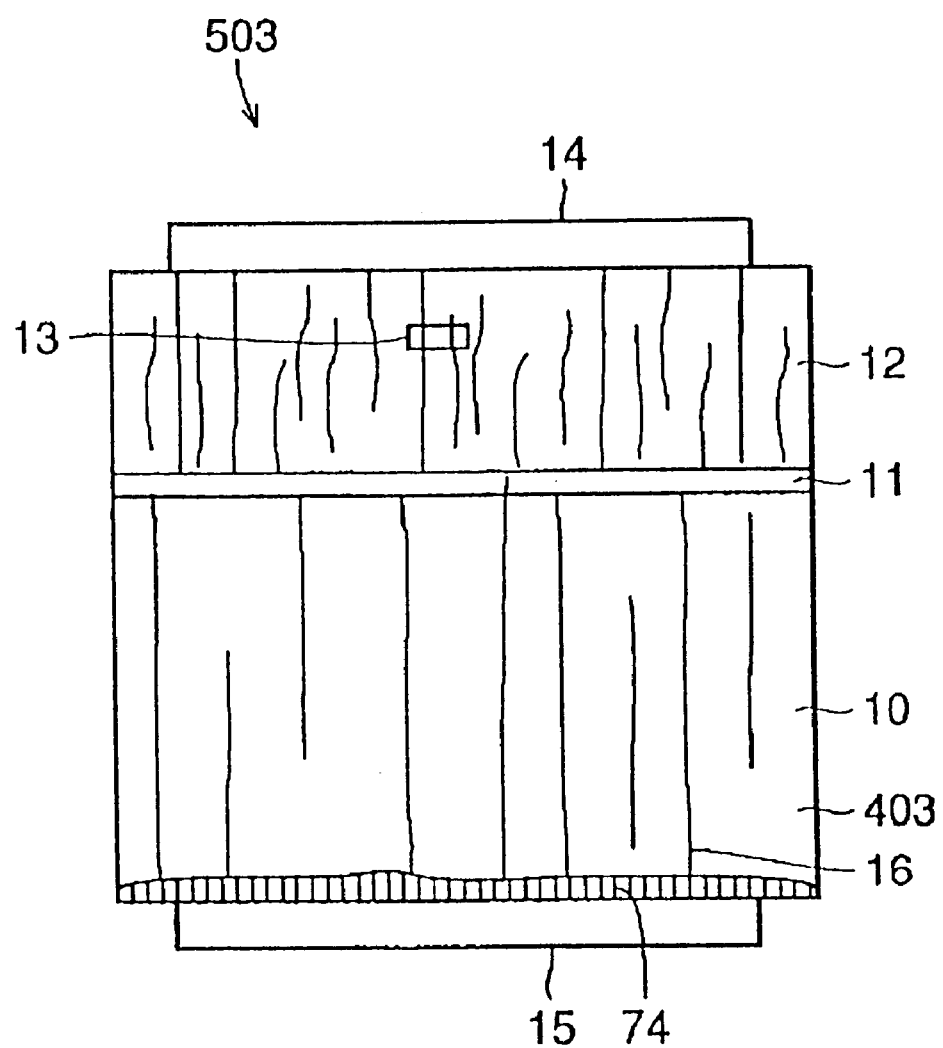
FIG. 9 is a front view of a further example of a semiconductor laser device according to the first embodiment of the present invention.

Referring to FIG. 9, a semiconductor laser device 503 is described as a further example according to the present embodiment. In semiconductor laser device 503, a groove is formed on the back side of the wafer, i.e. a plane on the n-GaN substrate 10 side, to divide wafer 31 into bar-like wafer pieces. This results in an end face different from the end face shown in FIG. 8 in the respect that the groove for dividing the wafer into bar-like wafer pieces is formed all the way from one end to the other end of the wafer. The other conditions are the same as those with semiconductor laser devices 501 and 502.

FIG. 9 is an enlarged view of a substantial part of mirror end face 403 of semiconductor laser device 503. Vertical streaks 16 are generated on the n-GaN substrate 10 side end face in a percentage similar to that in the case with semiconductor laser device 501 (see FIG. 7), whereas a larger number of vertical streaks 16 are adversely generated on the layered lump 12 side end face compared to the n-GaN substrate 10 side. More specifically, for the surface roughness across a region extending for 4 µm in the direction perpendicular to the layering direction, RMS is 0.5 to 5 nm on the substrate side end face, whereas RMS is 1 to 20 nm on the layered lump side end face. This result is undesirable as in the case with semiconductor laser device 502. However, when the groove is formed to traverse the wafer from one end to the other end as in the case with mirror end face 403 of semiconductor laser device 503, linear dividing is possible irrespective of cleaving directions. Therefore, though it is inadvisable to use this end face as a mirror end face of a semiconductor laser device, this end face may be used as a plane to be divided into individual chip-like semiconductor laser devices, forming an angle of 90° with respect to the mirror end face.

Figure 3:
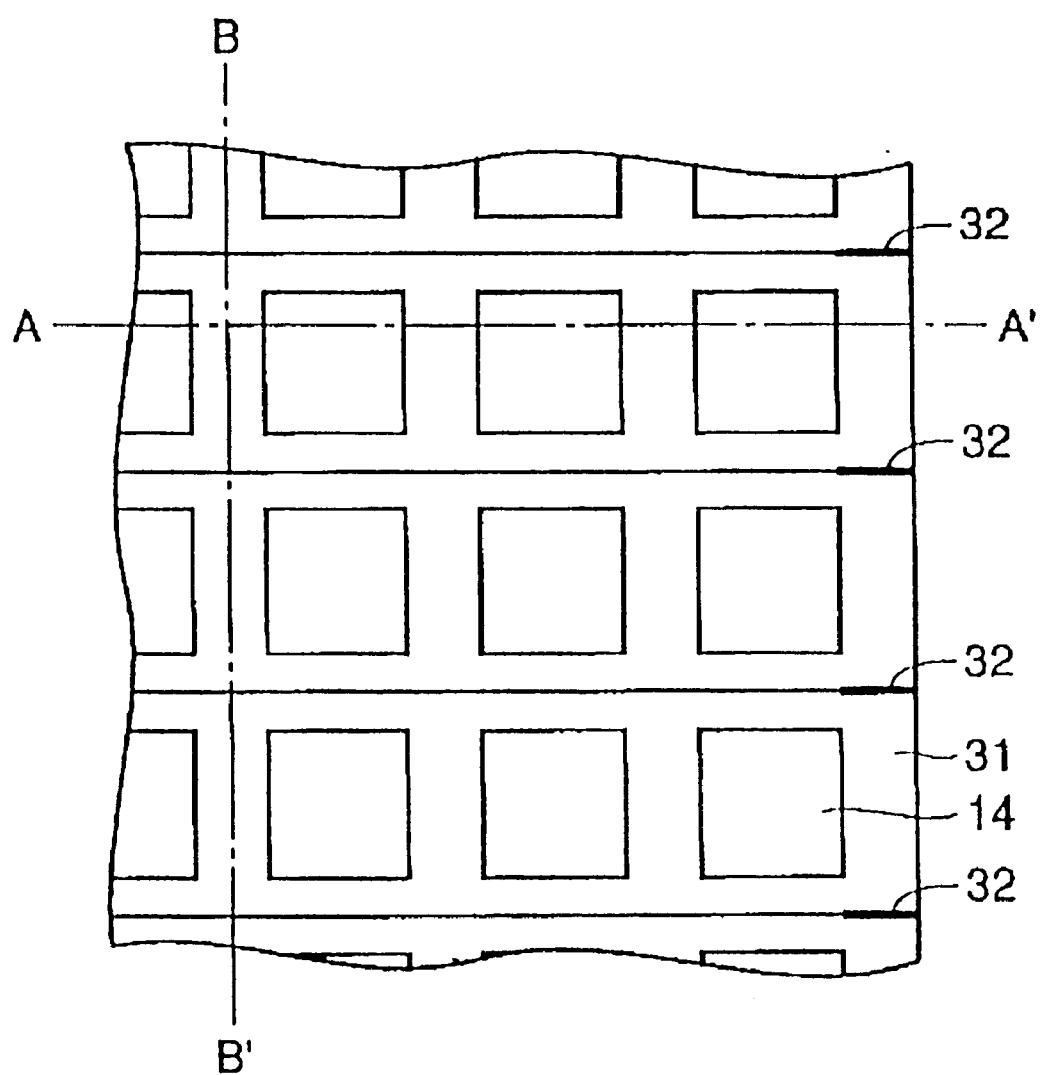
FIG. 3 illustrates the first step of wafer dividing included in a method of manufacturing the semiconductor laser device according to the first embodiment of the present invention.

In view of the above, in dividing wafer 31 shown in FIG. 3, it can be said that the method of obtaining mirror end face 401 shown in FIG. 7 is appropriately used for dividing in A–A' direction whereas the method of obtaining mirror end face 403 (see FIG. 9) is appropriately used for dividing in B–B' direction.

Thus, according to the present invention, the flatness of the end face on the layered lump side is enhanced compared to that of the conventional semiconductor laser device, having 0.1 mm or lower of RMS of the surface roughness across a region extending for 4 µm in the direction perpendicular to the layering direction. The roughness to such a degree would cause only a very small reduction of reflectance, 1% or lower, compared to that of a full flat mirror plane. Therefore, the semiconductor laser device according to the present invention can solve the problem 2 of the conventional semiconductor laser device.

Moreover, in the semiconductor laser device according to the present embodiment, the upper surface of layered lump 12 is extremely flat. Specifically, the average value of the surface roughness is Ra=100 Å or lower. This is because layered lump 12 of hexagonal nitride-based semiconductors is grown with the GaN low temperature growth layer interposed as buffer layer 11, to form layered lump 12 while the effect of the residual stress layer near the surface of n-GaN substrate 10 is cut by the GaN low temperature growth layer.

Figure 10:
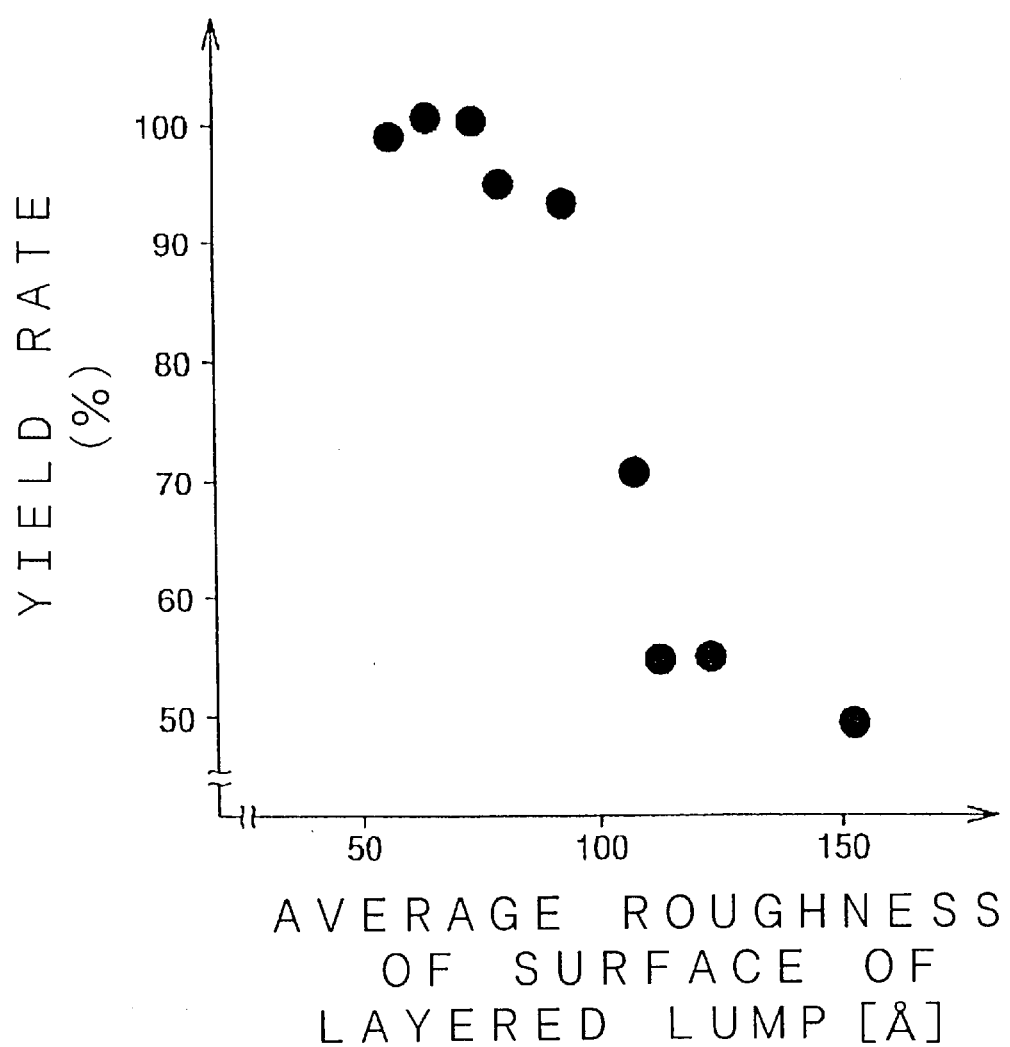
FIG. 10 is a graph showing a yield of a semiconductor laser device with respect to a change in an average surface roughness Ra of a layered lump of the semiconductor laser device according to the first embodiment of the present invention.

FIG. 10 shows a yield of the semiconductor laser device with respect to the change in the average surface roughness Ra of the layered lump 12. Here, the yield indicates a rate of a non-defective ones of all the semiconductor laser devices fabricated by dividing one wafer (2 inches in diameter) into chips, when the one having the size within the range of ±5 µm from 400 µm×400 µm is determined as non-defective items. As can dearly be seen from FIG. 10, the yield is dramatically improved when the average surface roughness of layered lump 12 is equal to or lower than 100 Å. That is, when the wafer having 100 Å or lower of the average roughness of the layered lump 12 is cleaved, the cleavage line can have, almost certainly, a linear line. Furthermore, in the present embodiment, the average surface roughness of layered lump 12 is set to be 100 Å or lower, so that the cleavage line can almost surely extend linearly, preventing the cleavage line from bending, which was the problem 3 in the conventional semiconductor laser device. Thus, the yield can be improved.

Figure 11:
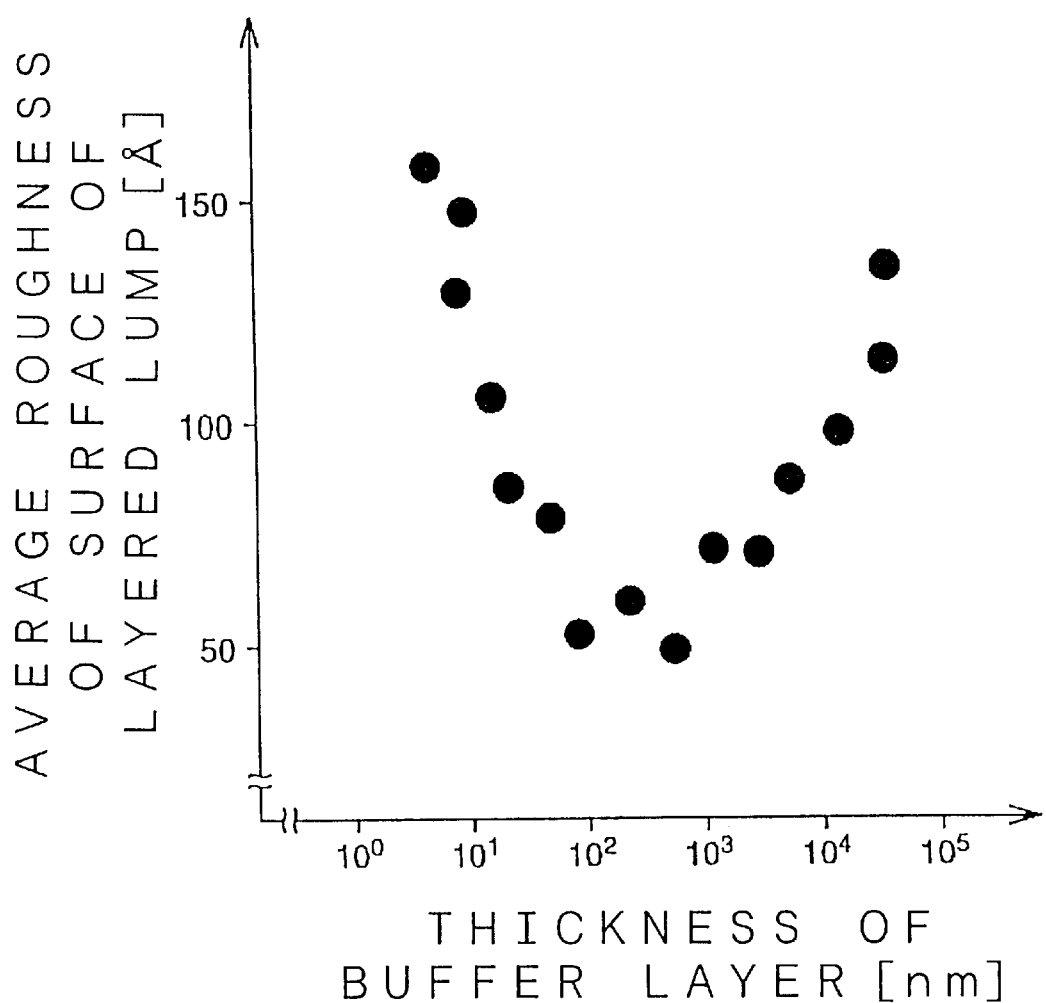
FIG. 11 is a graph showing an average surface roughness Ra of a layered lump with respect to a thickness of a buffer layer in the semiconductor laser device according to the first embodiment of the present invention.

FIG. 11 indicates the values of the average surface roughness Ra of the layered lump 12 with respect to the thickness of the buffer layer. It can be seen from FIG. 11 that the thickness of the buffer layer is preferably at least 10 nm and at most 10 µm in order to set the average surface roughness of layered lump 12 to be 100 Å or lower. More preferably, the thickness is at least 100 nm and at most 1 µm.

It is noted that, though the thickness of buffer layer 11 is set to be 100 nm in the present embodiment, the present invention is effective as long as the thickness is at least 10 nm and at most 10 µm.

Moreover, though the n-GaN low temperature growth layer is mainly described as buffer layer 11 in the present embodiment, buffer layer 11 may have any structure in which the upper and lower layers of buffer layer 11 are divided in different manners respectively, and e.g. a low temperature growth layer at least including AlGaInN may also be used as buffer layer 11. By using the same nitride semiconductor as that of n-GaN substrate 10 or layered lump 12 for a material of buffer layer 11, a resistance of buffer layer 11 can be reduced, achieving an effect of reduction in driving power for the semiconductor laser device. This also has the effect that the difference in the heat expansion coefficient between buffer layer 11 and the semiconductor layer adjacent thereto can be smaller, improving reliability of the semiconductor laser device. Thus, the low temperature growth buffer layer at least including AlGaInN is preferably used for a material of the buffer layer.

In addition, in the present embodiment, a similar effect can be obtained when an n-AlGaN clad layer, an n-AlGaN block layer and a p-AlGaN clad layer are used in place of the n-AlGaN/GaN superlattice clad layer, n-AlGaN/GaN superlattice block layer and p-AlGaN/GaN superlattice clad layer, respectively.

It is noted that, though negative electrode 15 are formed on the back side of n-GaN substrate 10 in the present embodiment, it can also be formed on the surface side of the n-type layer in layered lump 12. This can be done by etching a substantial part of the surface of wafer 31 by RIE or the like after growth of layered lump 12 until the surface reaches the n-GaN layer, to form negative electrode 15 on the surface to which the n-GaN layer is exposed. Here, the substrate may be a non-doped GaN substrate, and the buffer layer may be a non-doped GaN low temperature growth layer. In such a structure also, a similar effect can be obtained by application of the present invention.

Second Embodiment

Figure 12:
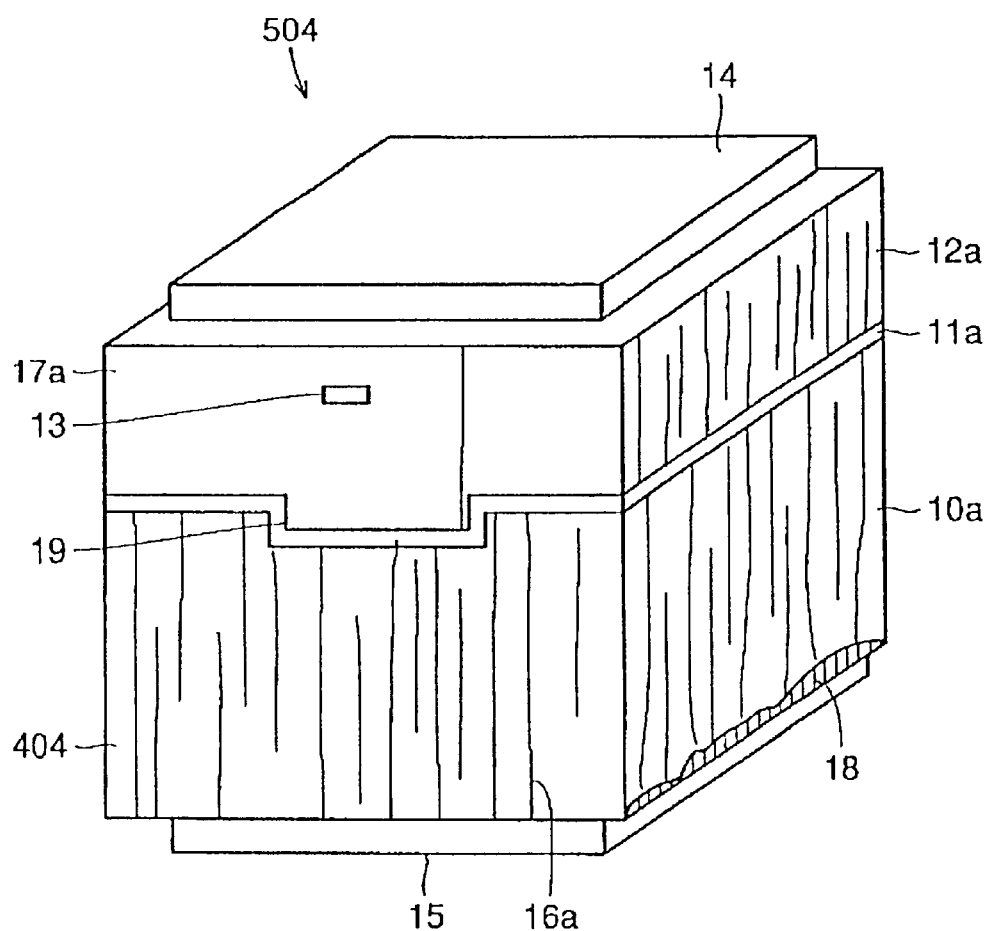
FIG. 12 is a perspective view of a semiconductor laser device according to the second embodiment of the present invention.

Referring to FIG. 12, the structure of a semiconductor laser device 504 according to the second embodiment of the present invention will be described.

An n-GaN substrate 10a is the same as that in the embodiment above in that the substrate includes n-GaN whose (0001) plane grows as a surface for crystal growth, except that a recess 19 having a depth of 1.75 $\mu$m is provided on the surface of the substrate and a layered lump 12a of hexagonal nitride-based semiconductors is formed thereon with a buffer layer 11a interposed. A mirror end face 404 is formed in parallel with a (1-100) plane. A stripe optical waveguide 13 is provided within layered lump 12 and serves to guide laser light. Optical waveguide 13 is formed on the portion of recess 19 provided on n-GaN substrate 10a. Moreover, positive electrode 14 and negative electrode 15 are the same as those in the embodiment above. A grooving portion 18 shown at a lower end of a side surface of n-GaN substrate 10a is a trace of a groove provided on a lower surface of a wafer piece (which is later to be a lower surface of n-GaN substrate 10a) for dividing the wafer piece into individual semiconductor laser devices 504. The groove is formed by scribing, and is perpendicular to the (1-100) plane of layered lump 12a. A number of vertical streaks 16a can be seen on the n-GaN substrate 10a side of mirror end face 404. On the other hand, the layered lump 12a side of mirror end face 404 is formed to be a flat region 17a having few vertical streaks. An end face exposed onto mirror end face 404 of stripe optical waveguide 13 appears within flat region 17a.

Figure 13:
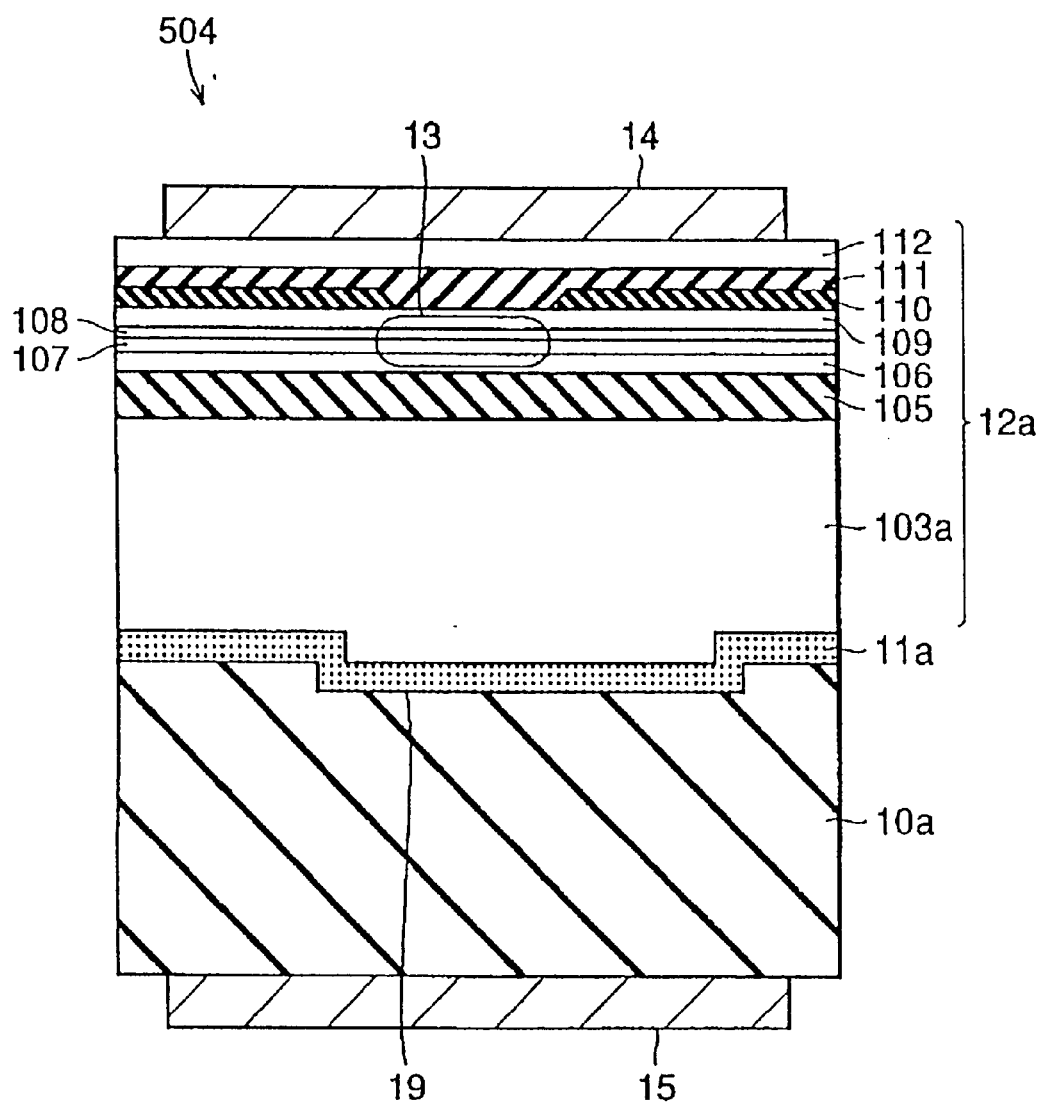
FIG. 13 illustrates a layered lump of the semiconductor laser device according to the second embodiment of the present invention.

Referring to FIG. 13, each layer exposed to mirror end face 404 of semiconductor laser device 504 will be described in more detail. FIG. 13 is a front view of mirror end face 404, particularly showing details of the structure of layered lump 12a of the hexagonal nitride-based semiconductor. In FIG. 13, however, roughness on mirror end face 401, such as vertical streaks 16 that are significantly shown in FIG. 12, are not illustrated for the sake of simplicity.

Layered lump 12a of hexagonal nitride-based semiconductors is formed by buffer layer 11a (film thickness of 100 nm) and an n-GaN contact layer 103a (film thickness of 4 $\mu$m) that are layered in this order from the n-GaN substrate 10a side. In addition, on the upper side of n-GaN contact layer 103a, n-AlGaN/GaN superlattice clad layer 105 and the like are layered. The thickness of each layer and the layering order from n-AlGaN/GaN superlattice clad layer 105 to p-GaN contact layer 112 are the same as those in the semiconductor laser device according to the first embodiment. The role of each portion at laser oscillation is also similar to that in the semiconductor laser device according to the first embodiment. Optical waveguide 13 is, however, formed to be located above recess 19 provided on n-GaN substrate 10a. Layered lump 12a collectivity indicates the structure of the layers from n-GaN contact layer 103a to p-GaN contact layer 112.

On mirror end face 404 of semiconductor laser device 504 according to the present embodiment, as for the surface roughness across a region extending for 4 $\mu$m in the direction perpendicular to the layering direction, RMS is 1 to 10 nm on the n-GaN substrate 10a side, whereas RMS is 0.1 nm or lower on the layered lump 12a side, the latter being a half or less of the former.

Next, a method of manufacturing semiconductor laser device 504 according to the present embodiment will be described with reference to FIGS. 12 and 13. The manufacturing method is basically the same as that in the first embodiment, except that the step of forming recess 19 is inserted after n-GaN substrate 10 is washed. Specifically, an SiO$_2$ mask is patterned using a photolithography technique on the washed n-GaN substrate 10. The mask here has a shape of a stripe having a width of 5 $\mu$m and is provided at intervals of 5 $\mu$m in the <11-20> direction as in the case with the stripe optical waveguide 13 of semiconductor laser device 504. The value of the width/interval of the SiO$_2$ mask is set to be in the range between 0.5 and 3. The thickness of the SiO$_2$ mask is set to be in the range between 1000 and 5000 Å (e.g. 3500 Å). Next, the surface of n-GaN substrate 10 on which the SiO$_2$ mask is provided is etched by e.g. the RIE technique to obtain n-GaN substrate 10a. The etching here may also be performed by another method such as the use of a reactive ion beam etching (RIBE) device or spattering. The depth of etching is set to be in the range between 0.1 and 3 $\mu$m (e.g. 1.75 $\mu$m). Subsequently, the SiO$_2$ mask left on the surface of the n-GaN substrate is etched using a water solution of hydrogen fluoride, to be removed.

The subsequent steps are similar to the steps in the manufacturing method described in the first embodiment, so that the description thereof will not be repeated. The material of buffer layer 11a is also the same as that of buffer layer 11 described in the first embodiment.

When power is applied to semiconductor laser device 504 according to the present embodiment obtained as described above, a room-temperature continuous oscillation is generated at 60 mA or higher. The oscillation spectrum in the threshold current of semiconductor laser device 504 is unimodal as in the case shown in FIG. 6. This can be obtained possibly because the substrate leaking mode can be suppressed for the same reason as described in the first embodiment. Therefore, the present embodiment can also solve the problem 1.

Moreover, in the present embodiment also, for the flatness of the layered lump 12a side end surface, RMS of the surface roughness is 0.1 nm or lower as in the case with the first embodiment, so that the problem 2 can be solved.

Furthermore, the semiconductor laser device according to the present embodiment has an extremely flat upper surface of layered lump 12a. Specifically, the average value of the surface roughness is Ra=100 Å or lower. It is considered that this can be attained also for the same reason as described in the first embodiment. Therefore, the problem 3 can also be solved.

In addition, semiconductor laser device 504 according to the present embodiment has a reduced number of crystal defects in optical waveguide 13, compared to those in semiconductor laser devices 501, 502 and 503 according to the first embodiment. This can possibly be achieved for the reasons described below. When a layered lump is formed under an appropriate condition on the n-GaN substrate on which recess 19 is formed, a material of the layered lump grows to sequentially cover the steps formed by recess 19, preventing optical waveguide 13 from being affected by crystal defects of the n-GaN substrate, resulting that the crystal defects in the optical waveguide is reduced. Consequently, it can be said that recess 19 formed at a part of the n-GaN substrate surface and optical waveguide 13 formed thereon have brought about such an effect.

As such, the number of crystal defects in the optical waveguide is reduced, so that the life duration of the semiconductor laser device can be improved compared to the case in the first embodiment.

It is noted that, in the present embodiment, the thickness and material of the buffer layer and the position where the electrodes are formed are the same as those described in the first embodiment.

Third Embodiment

Figure 14:
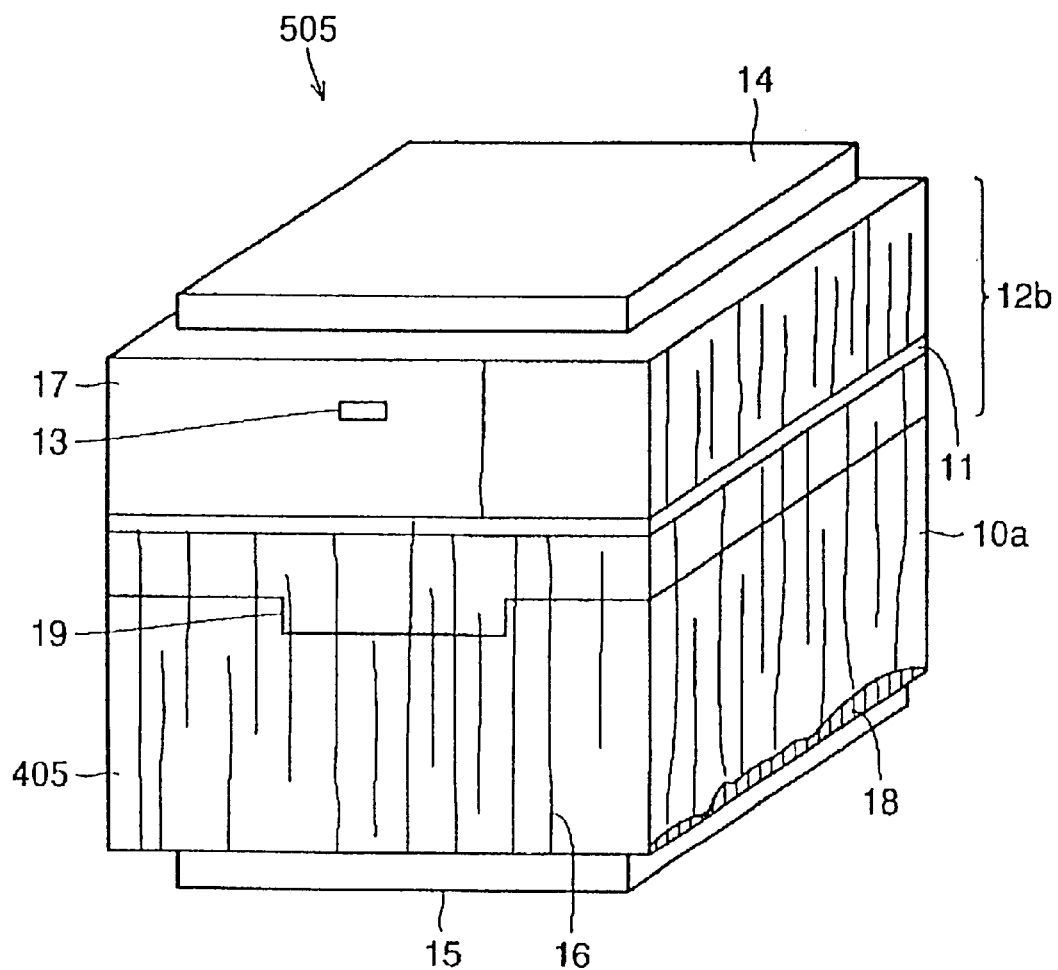
FIG. 14 is a perspective view of a semiconductor laser device according to the third embodiment of the present invention.

Referring to FIG. 14, the structure of a semiconductor laser device 505 according to the third embodiment of the present invention will be described.

An n-GaN substrate 10a is the same as each substrate in the embodiments described above in that the substrate includes n-GaN whose (0001) plane grows as a surface for crystal growth, and is the same as n-GaN substrate 10a according to the second embodiment in that recess 19 having a depth of 1.75 $\mu$m is provided on the surface thereof A layered lump 12b of hexagonal nitride-based semiconductors is formed on an upper side of n-GaN substrate 10a without a buffer layer interposed. Buffer layer 11 is inserted into the middle of layered lump 12b. A mirror end face 405 is formed in parallel with a (1-100) plane. Optical waveguide 13 is formed to be located above recess 19 provided on n-GaN substrate 10a as in the case with semiconductor laser device 504 according to the second embodiment. Optical waveguide 13 is, however, formed on an upper side of buffer layer 11. Arrangement and roles of positive electrode 14 and negative electrode 15 are the same as those described in the first embodiment. Grooving portion 18 is also the same as that described in the first embodiment.

A number of vertical streaks 16 can be seen on the side including n-GaN substrate 10a on mirror end face 405 when buffer layer 11 is taken as a boundary. On the other hand, the side including optical waveguide 13 on mirror end face 405 when buffer layer 11 is taken as a boundary forms a flat region 17 where few vertical streaks can be seen. The end face of optical waveguide 13, which is exposed to mirror end face 405, appears within flat region 17.

Figure 15:
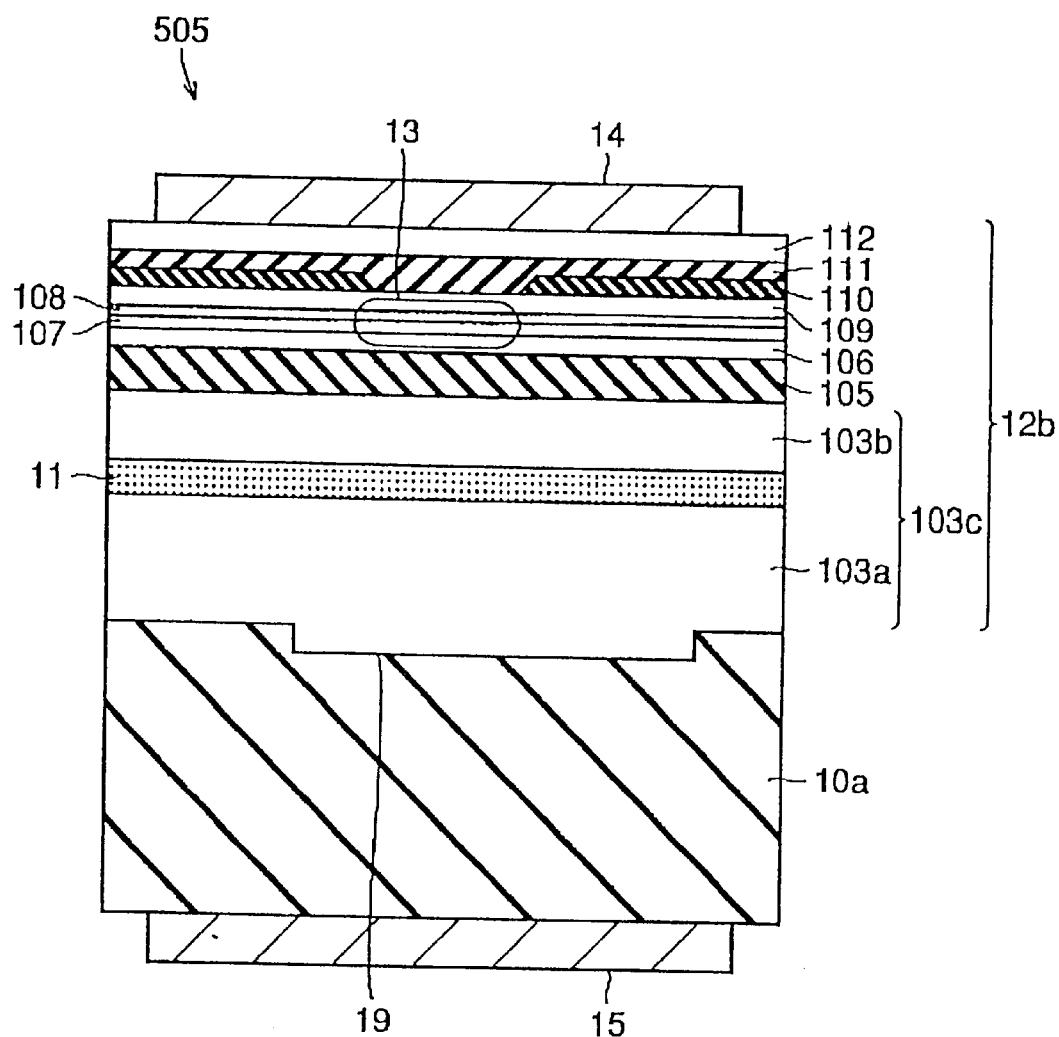
FIG. 15 illustrates a layered lump of the semiconductor laser device according to the third embodiment of the present invention.

Referring to FIG. 15, each layer exposed onto mirror end face 405 of semiconductor laser device 505 will be described in more detail. FIG. 15 is a front view of mirror end face 401, and particularly showing details of the structure of layered lump 12b of hexagonal nitride-based semiconductors. However, FIG. 15 illustrates no roughness on mirror end face 405 such as vertical streaks 16 significantly shown in FIG. 14, for the sake of simplicity.

The thickness of each layer constituting layered lump 12b and the order of layering are basically the same as those for layered lump 12 described in the first embodiment. However, an n-GaN contact layer 103c having a film thickness of 10 $\mu$m is arranged in the present embodiment, in place of n-GaN contact layer 103 having the film thickness of 4 $\mu$m used in the first embodiment. The n-GaN contact layer 103c is formed by two layers, i.e. n-GaN contact layer 103a and n-GaN contact layer 103b, and buffer layer 11 (film thickness of 100 nm) is arranged between n-GaN contact layer 103a and n-GaN contact layer 103b.

The role of each part at laser oscillation is the same as that in the semiconductor laser device according to the first embodiment. Optical waveguide 13 is formed to be located above recess 19 provided on n-GaN substrate 10a as in the second embodiment. Layered lump 12b collectively indicates the layered structure from n-GaN contact layer 103c to p-GaN contact layer 112.

Figure 16:
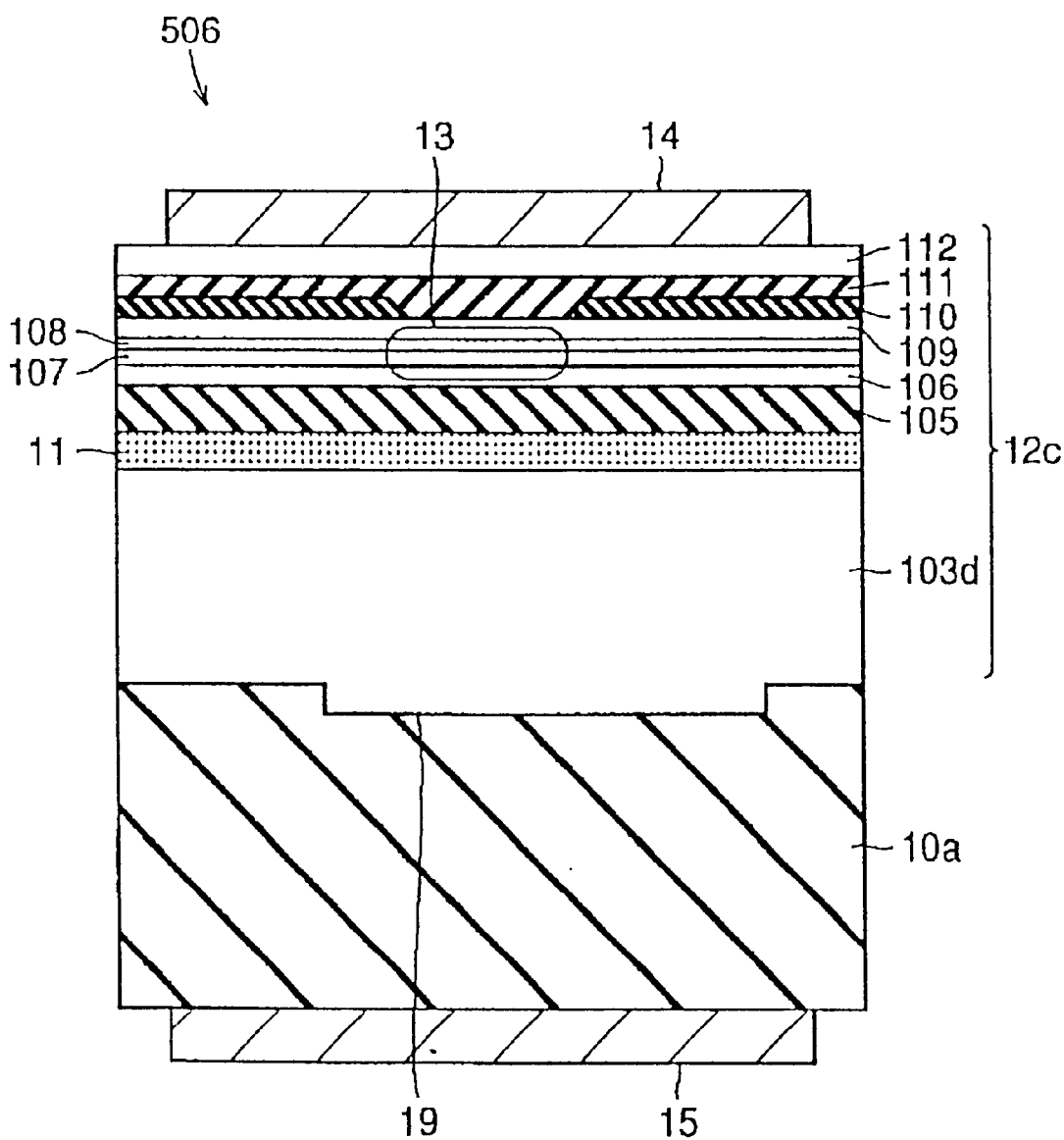
FIG. 16 illustrates a layered lump of another example of a semiconductor laser device according to the third embodiment of the present invention.

Referring to FIG. 16, a semiconductor laser device 506 will be described as another example of a semiconductor laser device according to the present embodiment. In semiconductor laser device 506, arrangement position of buffer layer 11 in layered lump 12c of hexagonal nitride semiconductors is different from that in semiconductor laser device 505. Thus, n-GaN contact layer 103d, having the thickness of 10 $\mu$m, is not divided into two layers and rather is formed of one layer. Buffer layer 11 (film thickness of 100 nm) is arranged between n-GaN contact layer 103d and n-AlGaN/GaN superlattice clad layer 105. The other components are similar to those of semiconductor laser device 505.

Figure 17:
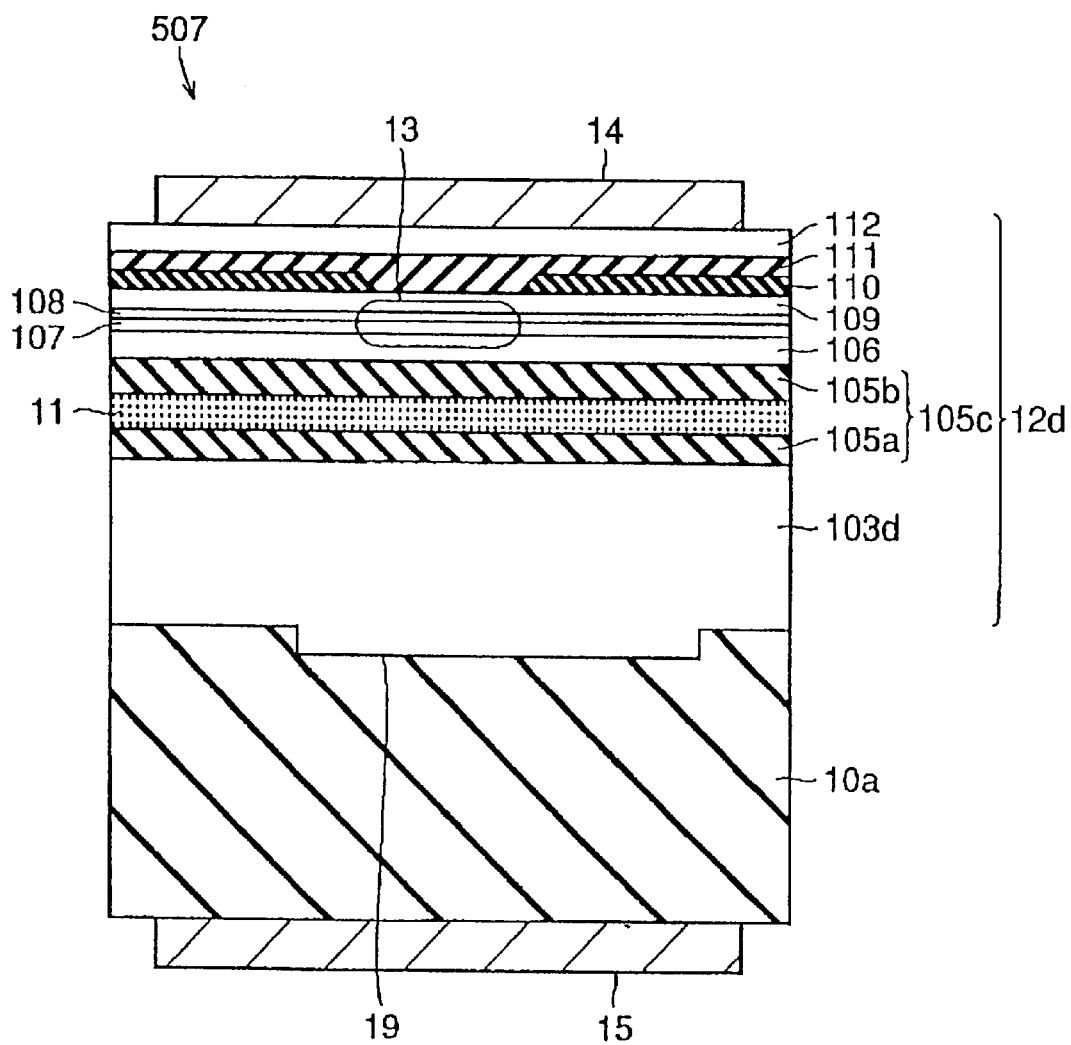
FIG. 17 illustrates a layered lump of a further example of a semiconductor laser device according to the third embodiment of the present invention.

Referring to FIG. 17, a semiconductor laser device 507 will be described as a further example of a semiconductor laser device according to the present embodiment. In semiconductor laser device 506, an arrangement position of buffer layer 11 in a layered lump 12d of hexagonal nitride semiconductors is different from that in semiconductor laser device 505 or 506. The n-AlGaN/GaN superlattice clad layer 105c is divided into two layers of an n-AlGaN/GaN superlattice clad layer 105a and an n-AlGaN/GaN superlattice clad layer 105b, and buffer layer 11 (film thickness of 100 nm) is arranged between n-AlGaN/GaN superlattice clad layer 105a and n-AlGaN/GaN superlattice clad layer 105b. The other components are similar to those of semiconductor laser device 505.

Semiconductor laser devices 505, 506 and 507 according to the present embodiment can have effects similar to those in the first embodiment, so that the problems 1 to 3 can be solved.

In the present embodiment, n-GaN substrate 10a having recess 19 is used. This results in the effect of reducing crystal defects in optical waveguide 13 as in the second embodiment. However, even if n-GaN substrate 10 without recess 19 is used, effects similar to that in the first embodiment can still be obtained, except for the effect of reducing crystal defects in optical waveguide 13.

In addition to the above, a structure is possible in which buffer layer 11 is arranged between the n-AlGaN/GaN superlattice clad layer and n-GaN optical guide layer, or is arranged within the n-GaN optical guide layer. These can also have the effects of the present invention. However, in such a structure, the position of buffer layer 11 is close to optical waveguide 13, possibly affecting the FFP profile in a perpendicular direction of laser light, which is unpreferable in practice.

Fourth Embodiment

Though only one layer of buffer layer 11 was provided in the embodiments described above, a plurality of buffer layers may also be provided. The buffer layers may be arranged between the n-GaN substrate and n-GaN contact layer as shown in FIG. 13, or may be within the n-GaN contact layer as shown in FIG. 15. Moreover, the buffer layers may also be arranged between the n-GaN contact layer and n-AlGaN/GaN superlattice clad layer as shown in FIG. 16, or may be within the n-AlGaN/GaN superlattice clad layer as shown in FIG. 17.

Here, when RMS of the surface roughness is compared between the lower side of the buffer layer located at the bottom, i.e. the region including a side surface of the n-GaN substrate, and the upper side of the buffer layer located at the top, i.e. the region including an end face of the optical waveguide, the former has RMS of 1 to 10 nm, whereas the latter has RMS of 0.1 nm or lower, which is a half or less of the former.

This can also attain the same effect as in the first embodiment, and therefore the problems 1 to 3 can be solved. Similar effects can be obtained as to solution of the problems 1 to 3, independent of the presence or absence of the recess on an upper surface of the n-GaN substrate.

Fifth Embodiment

The structure of a semiconductor laser device according to the fifth embodiment of the present invention will be described. In the embodiments described above, the two mirror end faces constituting the optical cavity had the same condition. On the other hand, in the present embodiment, one of the two mirror end faces constituting the optical cavity has a flat region 17 as shown in FIG. 7, whereas the other one has many vertical streaks 16 in a region on the layered lump 12 side as shown in FIGS. 8 and 9. Here, the side of the mirror end face as shown in FIG. 7 is used as a laser light emitting surface. The other components are similar to those of semiconductor laser devices described in the embodiments above.

In the semiconductor laser device according to the present embodiment, one of the two mirror end faces constituting the optical cavity has a larger value of surface roughness, which may make the device somewhat inferior to those in the embodiments described earlier, yet the effects of the present invention can still be obtained so that the problems 1 to 3 can be solved.

It is noted that the other components of the semiconductor laser device may be formed in accordance with any one of the first to fourth embodiments.

Sixth Embodiment

Figure 18:
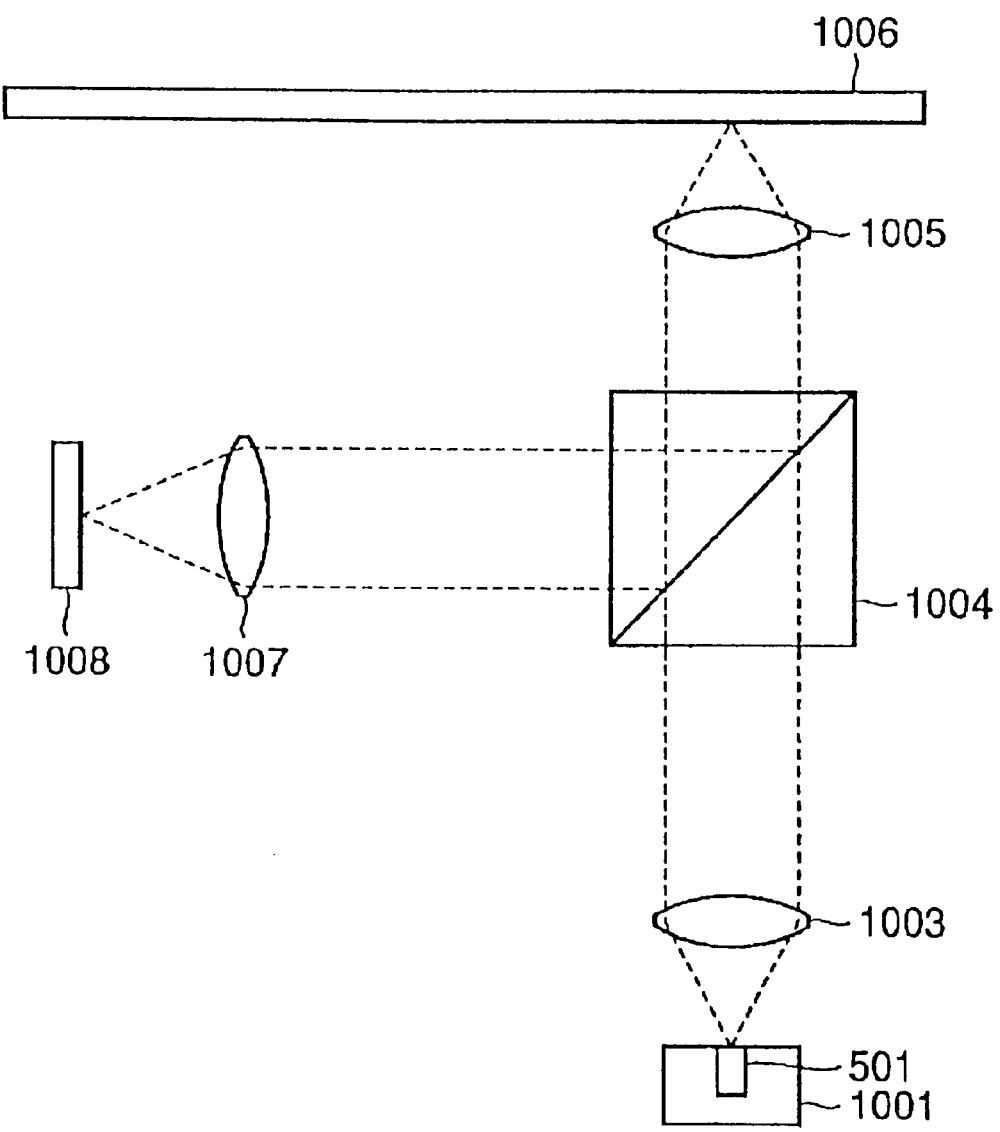
FIG. 18 is a configuration view of an optical information reproducing apparatus according to the sixth embodiment of the present invention.

Referring to FIG. 18, the structure of an optical information reproducing device according to the sixth embodiment of the present invention will be described. The optical information reproducing device includes a base platform 1001, a semiconductor laser device 501 according to the first embodiment provided on base platform 1001, a collimator lens 1003, a beam splitter 1004, an objective lens 1005, a condensing lens 1007 for condensing reflected light, and an photodetector 1008 detecting the condensed light.

Laser light emitted from semiconductor laser device 501 passes through collimator lens 1003 and is converted into parallel light or approximately parallel light. The converted light then passes through beam splitter 1004 and objective lens 1005, and is condensed on an information recording plane of an optical disk 1006. Bit information is written on the information recording plane of optical disk 1006 by roughness, magnetic modulation or refractive index modulation. The light reflected on the information recording plane of optical disk 1006 is spilt by beam splitter 1004 and is condensed on photodetector 1008 by condensing lens 1007. At photodetector 1008, an optically detected signal is converted into an electric signal, and recorded information is read.

Figure 19:
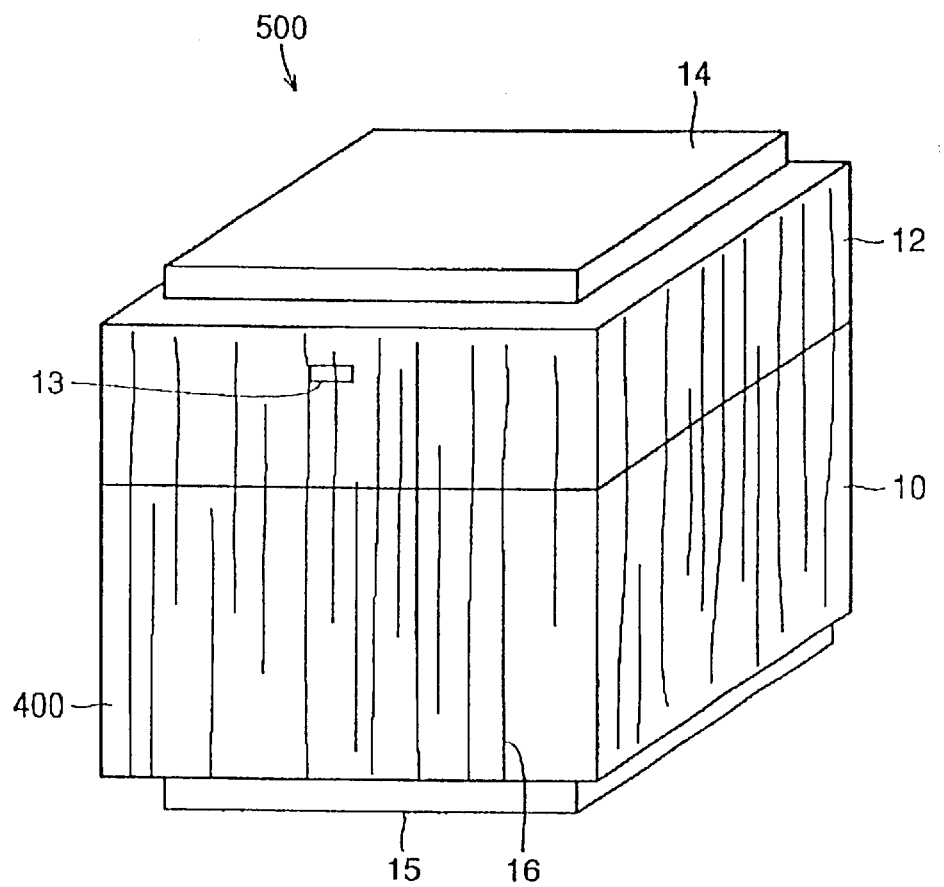
FIG. 19 is a perspective view of the semiconductor laser device according to the conventional technique.
Figure 20:
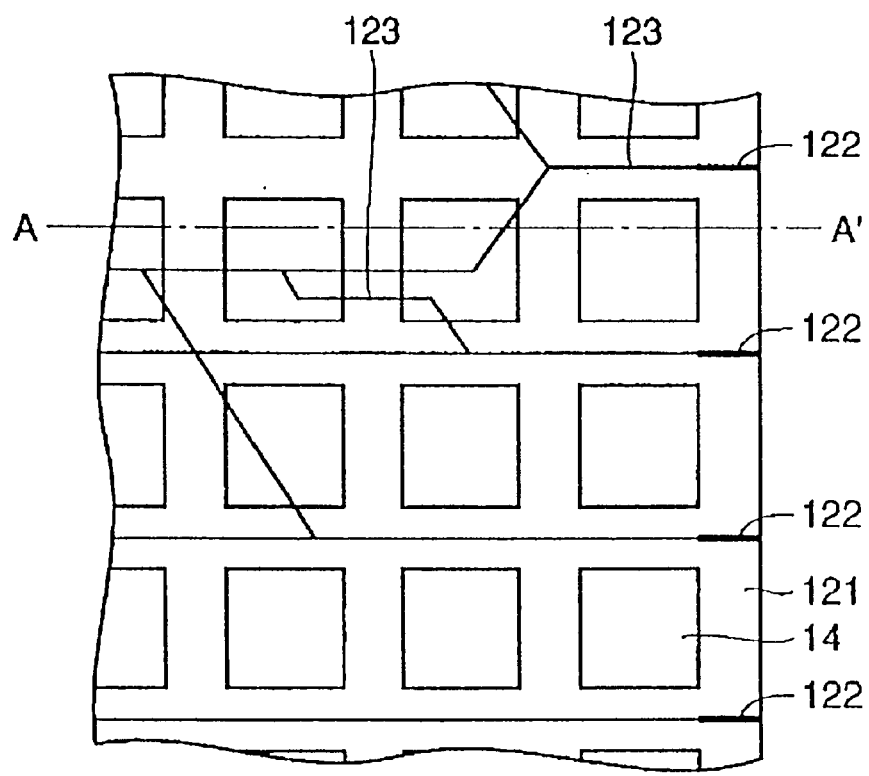
FIG. 20 illustrates the steps of wafer dividing included in the method of manufacturing the semiconductor laser device according to the conventional technique.

In the optical information reproducing device, a semiconductor laser device having a flat mirror end face on the layered lump side and a good FFP, so that the light was condensed with high resolution on the information recording plane of optical disk 1006 by objective lens 1005. Moreover, a semiconductor laser device is used, in which oscillation of the substrate leaking mode is suppressed such that a unimodal envelope is shaped by a vertical mode peak of oscillation spectrum, so that the written information can be read with a bit error rate of $10^{-6}$ from the optical disk on which the information is recorded at a high density of $5M/mm^2$. On the other hand, when the conventional semiconductor laser device 500 (see FIG. 19) was used in place of semiconductor laser device 501 in FIG. 18, the bit error rate was approximately $10^{-3}$ under a similar condition, which would be inappropriate for practical use.

Thus, information can be read with a low error rate from an optical disk on which information is recorded at a high density, so that it is ensured that the optical information reproducing device according to the present embodiment allows light to be condensed with high resolution onto an optical disk and thus the S/N ratio to be improved.

Though a certain plane was selected for orientation in forming the mirror end face in each of the embodiments above, a plane parallel to any arbitrary one of a {0001} plane, a {11-20} plane and a {1-100} plane that are cleavage planes unique to a hexagonal nitride-based semiconductor may be selected. However, among others, the {1-100} plane is preferable for its good cleaving property. Thus, any one of a (10-10) plane, a (01-10) plane, a (-1100) plane, a (-1010) plane, a (0-110) plane and a (1-100) plane is preferably used as a mirror end face.

Moreover, though a scribing method was described as a method of forming a groove onto a substrate, other methods such as a dicing method may alternatively be used.

Furthermore, the optical waveguide structure of the semiconductor laser device to which the present embodiment is applied is not limited to the examples described in the embodiments above. Starting with the self aligned structure (SAS) shown in the first and second embodiments, other structures such as a ridge structure, an electrode stripe structure, an buried hetero (BH) structure, and a channeled substrate planer (CSP) structure can also obtain the effect similar to the ones described above, not affecting the essentiality of the present invention.

Still further, each semiconductor layer device according to each of the embodiments above may be formed of, not limited to the materials described above and in addition to $Al_xIn_yGa_{1-x-y}N$ ($0 \leq x$, $y \leq 1$), a hexagonal structured crystal in which a part of the group III element (at most approximately 20%) thereof is substituted by another element such as B, Cr, V, Ti, Nb, Ta, Zr, Sc, Tl, Gd and La may alternatively be used. Moreover, a hexagonal structured crystal in which a part of the N element (at most approximately 20%) is substituted by another element such as P, As and Sb, may alternatively be used. Furthermore, a layer of a different crystal material may be mixed into a part of a multilayer structure of a hexagonal structured crystal. Moreover, B, Al, In, Ti, P, As, Sb, Be, Mg, Cd, Zn, C, Si, Ge, Sn, O, S, Se, Te, H, Sc, Cu, Fe, Ti, V, Cr, Y, Zr, Nb, lantanoid and the like may be added into each semiconductor layer.

It is noted that, in each of the embodiments described above, though the buffer layer is formed across the entire surface at a height between a gallium nitride substrate and a layered lump including an active layer, the buffer layer may not necessary be formed on the entire surface, and may be formed in at least a region between the gallium nitride substrate and the optical waveguide. In such a case also, mirror end face can be flat in a region which is to be the optical waveguide, so that the effects of the present invention, such as suppression of the substrate leaking mode and improvement of the yield by planarizing the surface of the layered lump, can be obtained.

Moreover, though the stripe optical waveguide is formed on the recess portion provided on the n-GaN substrate in the second to six embodiments above, the optical waveguide may also be formed at a location other than the above, and the effect of the present invention can still be produced as long as the requirement of the claims of the present invention is fulfilled.

According to the present invention, a buffer layer is provided between a first semiconductor layer and second semiconductor layer. As a result, the average roughness of an exposed portion of the second semiconductor layer is a half or less of that of the exposed portion of the first semiconductor layer of the entire mirror end face, so that the region on the first semiconductor layer side of the mirror end face has a reflectance lower than the region on the second semiconductor layer side. Therefore, the substrate leaking mode can be suppressed.

Moreover, interposition of the buffer layer allows cleaving on the second semiconductor layer side independent of the effect of the stress at cleaving on the first semiconductor layer side, resulting in a surface having a high flatness and few vertical streaks, facilitating manufacturing of an accurate semiconductor device with little variation in reflectance and few cracks.

In addition, interposition of the buffer layer between the first semiconductor layer and the second semiconductor layer at the time of layering the second semiconductor layer blocks the effect of a residual stress layer on the surface of the first semiconductor layer, suppressing occurrence of roughness on the surface of the second semiconductor layer. As a result, the second semiconductor layer can be prevented from cleavage in an undesired direction due to the effect of the roughness on the surface, so that the semiconductor device which is precisely cleaved in an accurate direction can easily be manufactured.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor laser device, comprising:
   a first semiconductor layer including a gallium nitride substrate;
   a second semiconductor layer including a hexagonal nitride-based semiconductor, said second semiconductor layer including an active layer and provided on an upper side of said first semiconductor layer; and
   a mirror end face formed by cleavage such that both of said first semiconductor layer and said second semiconductor layer have side surfaces, respectively, exposed onto an approximately same plane,
   an average roughness of an exposed portion of said second semiconductor layer being at most a half of an average roughness of an exposed portion of said first semiconductor layer, on said mirror end face.

2. The semiconductor laser device according to claim 1, further comprising a buffer layer provided between said first semiconductor layer and said second semiconductor layer.

3. The semiconductor laser device according to claim 2, wherein said buffer layer includes $In_xAl_yGa_{1-x-y}N(0 \leq x \leq 1, 0 \leq y \leq 1)$.

4. The semiconductor laser device according to claim 2, wherein said buffer layer has a thickness of at least 10 nm and at most 10 $\mu$m.

5. The semiconductor laser device of claim 2, wherein said gallium nitride substrate has an upper surface with a linear recess.

6. An optical information reproducing apparatus, comprising the semiconductor laser device according to claim 1 as a light source, wherein
   said optical information reproducing apparatus converts reflection light of laser light emitted from said light source onto an optical disk having an information recording plane, to reproduce information recorded on said optical disk.

7. The semiconductor laser device of claim 2, wherein said buffer layer is a low temperature growth layer.

8. The semiconductor laser device of claim 2, wherein said buffer layer is formed of one of non-doped GaN and n-type GaN.

9. The semiconductor laser device of claim 2, wherein said buffer layer has a thickness of at least 100 nm and at most 1 $\mu$m.

10. The semiconductor laser device of claim 5, wherein said second semiconductor layer includes a linearly formed optical waveguide and said optical waveguide is formed above said recess.

11. The semiconductor laser device of claim 2, formed in a rectangular parallelepiped and having a grooving portion at a lower end of two of four sides thereof that do not correspond to said mirror end surface.

* * * * *